(12) United States Patent
Joe

(10) Patent No.: US 9,720,047 B2
(45) Date of Patent: *Aug. 1, 2017

(54) APPARATUS AND METHOD FOR ESTIMATING PARAMETER OF SECONDARY BATTERY

(71) Applicant: LG CHEM, LTD., Seoul (KR)

(72) Inventor: Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 393 days.

This patent is subject to a terminal disclaimer.

(21) Appl. No.: 14/559,552

(22) Filed: Dec. 3, 2014

(65) Prior Publication Data

US 2015/0084639 A1 Mar. 26, 2015

Related U.S. Application Data

(63) Continuation of application No. PCT/KR2013/011175, filed on Dec. 4, 2013.

(30) Foreign Application Priority Data

Dec. 4, 2012 (KR) .......................... 10-2012-0139776
Dec. 4, 2013 (KR) .......................... 10-2013-0149690

(51) Int. Cl.
*H01M 10/44* (2006.01)
*H01M 10/46* (2006.01)
(Continued)

(52) U.S. Cl.
CPC ...... *G01R 31/3624* (2013.01); *B60L 11/1861* (2013.01); *G01R 31/3651* (2013.01);
(Continued)

(58) Field of Classification Search
CPC .............. H01J 7/0047; H01J 2007/005; G01R 31/3606; G01R 31/3634; G01R 31/3631
(Continued)

(56) References Cited

U.S. PATENT DOCUMENTS

2003/0210056 A1\* 11/2003 Arai ................... G01R 31/3648
324/430
2006/0232277 A1 10/2006 Murakami et al.
(Continued)

FOREIGN PATENT DOCUMENTS

CN 101939892 A 1/2011
JP 2001-223033 A 8/2001
(Continued)

OTHER PUBLICATIONS

International Search Report, issued in PCT/KR2013/011175, dated Mar. 13, 2014.
(Continued)

*Primary Examiner* — Edward Tso
(74) *Attorney, Agent, or Firm* — Birch, Stewart, Kolasch & Birch, LLP

(57) ABSTRACT

Disclosed is an apparatus and method for estimating a parameter of a secondary battery. The apparatus according to the present disclosure includes a sensor means configured to measure a plurality of current-voltage data while a charging current decreases when a secondary battery is charged in such a pattern that the charging current increases to a peak value and then decreases, and a control means configured to receive an input of the plurality of current-voltage data from the sensor means, calculate a linear approximation equation representing a correlation between a current and a voltage from the plurality of current-voltage data, estimate an open-circuit voltage (OCV) of the secondary battery by reflecting a polarization voltage of the secondary battery quantified through a resistor-capacitor (RC) circuit on a Y intercept of the linear approximation equation, and estimate a state of charge (SOC) of the secondary battery from the estimated OCV.

27 Claims, 18 Drawing Sheets

(51) Int. Cl.
  *G01R 31/36* (2006.01)
  *B60L 11/18* (2006.01)
  *H01M 10/48* (2006.01)
  *G01R 31/00* (2006.01)

(52) U.S. Cl.
  CPC ........ *G01R 31/007* (2013.01); *G01R 31/3662* (2013.01); *H01M 10/48* (2013.01)

(58) Field of Classification Search
  USPC ........ 320/107, 112, 132, 149; 324/426, 427, 324/431, 433
  See application file for complete search history.

(56) References Cited

U.S. PATENT DOCUMENTS

| | | |
|---|---|---|
| 2007/0090805 A1 | 4/2007 | Mizuno et al. |
| 2008/0162059 A1 | 7/2008 | Murakami |
| 2010/0318252 A1 | 12/2010 | Izumi |
| 2011/0156713 A1 | 6/2011 | Akamine et al. |
| 2011/0224928 A1 | 9/2011 | Lin et al. |
| 2012/0219840 A1 | 8/2012 | Choi et al. |
| 2012/0310563 A1 | 12/2012 | Shigemizu et al. |
| 2013/0027047 A1 | 1/2013 | Yoshioka et al. |
| 2013/0116954 A1 | 5/2013 | Tazoe et al. |
| 2015/0051854 A1* | 2/2015 | Joe ................ G01R 31/3624 702/63 |

FOREIGN PATENT DOCUMENTS

| | | |
|---|---|---|
| JP | 2004-271445 A | 9/2004 |
| JP | 2007-121030 A | 5/2007 |
| JP | 2007-166789 A | 6/2007 |
| JP | 2011-43460 A | 3/2011 |
| JP | 2012-42457 A | 3/2012 |
| KR | 10-2006-0039445 A | 5/2006 |
| KR | 10-2007-0103406 A | 10/2007 |
| KR | 10-2010-0099667 A | 9/2010 |
| KR | 10-2012-0049875 A | 5/2012 |
| WO | WO 2011/155017 A1 | 12/2011 |

OTHER PUBLICATIONS

Written Opinion of the International Searching Authority, issued in PCT/KR2013/011175, dated Mar. 13, 2014.

* cited by examiner

US 9,720,047 B2

APPARATUS AND METHOD FOR ESTIMATING PARAMETER OF SECONDARY BATTERY

CROSS-REFERENCE TO RELATED APPLICATION

The present application is a continuation of International Application No. PCT/KR2013/011175 filed on Dec. 4, 2013, which claims priority to Korean Patent Application No. 10-2012-0139776 filed in the Republic of Korea on Dec. 4, 2012, and Korean Patent Application No. 10-2013-0149690 filed in the Republic of Korea on Dec. 4, 2013, the disclosures of which are incorporated herein by reference.

TECHNICAL FIELD

The present disclosure relates to an apparatus and method for estimating an electrochemical parameter of a secondary battery changing during charging or discharging of the secondary battery such as an open-circuit voltage (OCV) or a state of charge (SOC) of the secondary battery.

BACKGROUND ART

A battery is a device that produces electrical energy through electrochemical oxidation and reduction reactions, and has a wide range of various applications. For example, application of a battery is gradually expanding to a power source of handheld portable devices such as a mobile phone, a laptop computer, a digital camera, a video camera, a tablet computer, and an electric tool; various types of electric-powered devices such as an electric bike, an electric motorcycle, an electric vehicle, a hybrid vehicle, an electric boat, and an electric aircraft; an energy storage system used to store electricity generated through new renewable energy or excess electricity of a power plant; and an uninterruptible power supplier for stable power supply to various information and communication devices including a server computer and a base station for communication.

A battery includes three basic elements; one is an anode including a material which oxides while emitting electrons during discharging, another is a cathode including a material which reduces while accepting electrons during discharging, and the other is an electrolyte which allows ions to move between the anode and the cathode.

A battery may be classified into a primary battery that cannot be reused after discharged, and a secondary battery that can be charged and discharged repeatedly due to at least partially reversible electrochemical reactions.

As a secondary battery, a lead-acid battery, a nickel-cadmium battery, a nickel-zinc battery, a nickel-iron battery, a silver-oxide battery, a nickel metal hydride battery, a zinc-manganese dioxide battery, a zinc-bromine battery, a metal-air battery, and a lithium secondary battery are known. Among them, a lithium secondary battery has a higher energy density, a higher battery voltage, and a longer lifespan than the other secondary batteries, and for these reasons, is attracting the greatest attention in commercial aspects.

A lithium secondary battery has a characteristic that intercalation and deintercalation reactions of lithium ions occur at a cathode and an anode. That is, during discharging, lithium ions de-intercalated from an anode material included in an anode moves to a cathode through an electrolyte and are intercalated into a cathode material included in the cathode, and vice versa during charging.

In the lithium secondary battery, because a material used as a cathode material significantly affects performance of the secondary battery, various attempts have been made to provide a cathode material having a high energy capacity while maintaining stability at high temperature as well as having low manufacturing costs. However, there is still a limitation in satisfying all the industrial performance standards with only one cathode material.

Recently, with the growing concerns on exhaustion of fossil fuels and air pollution, there is a drastic increase in demand for eco-friendly energy. In this context, commercialization of an electric drive vehicle such as an electric vehicle or a hybrid vehicle that is powered and runs by electrical energy supplied from a secondary battery is being accelerated by developed countries.

When an electric drive vehicle runs, a state of charge (SOC) of a secondary battery is an electrochemical parameter needed to estimate a residual driving distance of the electric drive vehicle, and to control the start and end of the charge or discharge of the secondary battery.

An SOC of a secondary battery may be estimated accurately by measuring an open-circuit voltage (OCV) of the secondary battery. This is because an SOC of a secondary battery has a one-to-one relationship with an open-circuit voltage of the secondary battery. However, it is impossible to measure an OCV of a secondary battery during charging or discharging of the secondary battery.

Accordingly, to estimate an OCV of a secondary battery, conventionally, complex mathematical models or an experimentally-made lookup table from which temperature and voltage of the secondary battery is mapped to an OCV were used.

However, the former method has a disadvantage of requiring a complicated calculation, and the latter method has a drawback of reduced accuracy when applied during charging or discharging of a secondary battery under a dynamic condition. Particularly, in the case of an electric vehicle or a hybrid vehicle, when a driver works an accelerator pedal, a secondary battery is discharged at rapidly changing discharge rates (C-rate), and when the driver works a brake pedal, the secondary battery performs regeneration charging, and this process repeats. Therefore, there is a need for a new approach to estimate an SOC of a secondary battery conveniently and accurately in a dynamic usage environment of the secondary battery.

DISCLOSURE

Technical Problem

The present disclosure is designed to solve the problem of the related art, and therefore, the present disclosure is directed to providing an apparatus and method for estimating an electrochemical parameter of a secondary battery such as an open-circuit voltage (OCV) and/or a state of charge (SOC) conveniently and accurately during dynamic use of the secondary battery.

Also, the present disclosure is directed to providing an apparatus and method that estimates conveniently and accurately an OCV and/or an SOC of a secondary battery which includes a blended cathode material of at least two cathode materials in consideration of improved performance required for the secondary battery in the market and exhibits a unique electrochemical behavior due to the blended cathode material.

Technical Solution

To achieve the above objects, an apparatus for estimating a parameter of a secondary battery according to one aspect of the present disclosure includes a sensor means to measure a plurality of current-voltage data while a charging current decreases when a secondary battery is charged in such a pattern that the charging current increases to a peak value and then decreases, and a control means to receive an input of the plurality of current-voltage data from the sensor means, to calculate a linear approximation equation representing a correlation between a current and a voltage from the plurality of current-voltage data, and to estimate an open-circuit voltage (OCV) of the secondary battery by reflecting a polarization voltage of the secondary battery quantified through a resistor-capacitor (RC) circuit on a Y intercept of the linear approximation equation.

Preferably, the control means may further estimate a state of charge (SOC) of the secondary battery from the estimated OCV.

According to one aspect, the sensor means may measure the plurality of current-voltage data while a charging current decreases from a peak value to zero when the secondary battery is charged by a charging current profile in which the charging current increases from zero to the peak value and then decreases zero.

According to another aspect, the sensor means may measure the plurality of current-voltage data when the secondary battery is charged by the charging current profile after a discharging current of the secondary battery gradually decreases to zero.

According to still another aspect, the sensor means may measure the plurality of current-voltage data after a magnitude of the charging current decreases to $1/3$ or less based on the peak value.

According to yet another aspect, the sensor means may measure the plurality of current-voltage data after the magnitude of the charging current decreases to $1/6$ or less based on the peak value.

Preferably, the sensor means may measure at least two current-voltage data.

According to one aspect, the control means may estimate an SOC corresponding to the estimated OCV using a lookup table or a lookup function that defines a correlation between an OCV and an SOC.

According to another aspect, the sensor means may measure a temperature of the secondary battery and provide the measured temperature to the control means, and the control means may estimate an SOC corresponding to the temperature of the secondary battery and the estimated OCV using a lookup table or a lookup function that defines a correlation between an OCV and a temperature and an SOC.

To achieve the above objects, an apparatus for estimating a parameter of a secondary battery according to another aspect of the present disclosure includes a sensor means to measure current-voltage data repeatedly at a time interval while a secondary battery is charged in such a pattern that the charging current increases to a peak value and then decreases, and a control means to receive an input of the current-voltage data from the sensor means, to identify a plurality of current-voltage data measured while the charging current decreases from the peak value, to calculate a linear approximation equation representing a correlation between a current and a voltage from the plurality of current-voltage data, and to estimate an OCV of the secondary battery by reflecting a polarization voltage of the secondary battery quantified through an RC circuit on a Y intercept of the linear approximation equation.

Preferably, the control means may further estimate an SOC of the secondary battery from the estimated OCV.

According to one aspect, the control means may identify the plurality of current-voltage data among current-voltage data measured after a magnitude of the charging current decreases to $1/3$ or less based on the peak value.

According to another aspect, the control means may identify the plurality of current-voltage data among current-voltage data measured after a magnitude of the charging current decreases to $1/6$ or less based on the peak value.

Preferably, the control means may identify at least two current-voltage data.

According to one aspect, the control means may estimate an SOC corresponding to the estimated OCV using a lookup table or a lookup function that defines a correlation between an OCV and an SOC.

According to another aspect, the sensor means may measure a temperature of the secondary battery and provide the measured temperature to the control means, and the control means may estimate an SOC corresponding to the temperature of the secondary battery and the estimated OCV using a lookup table or a lookup function that defines a correlation between an OCV and a temperature and an SOC.

According to one aspect, the sensor means may measure current-voltage data repeatedly at a time interval while the secondary battery is charged in such a pattern that the charging current increases from zero to the peak value and then decreases zero.

According to another aspect, the sensor means may measure current-voltage data repeatedly at a time interval when the secondary battery is charged after a discharging current of the secondary battery gradually decreases to zero.

The above apparatuses for estimating the parameter of the secondary battery may further include a display means combined with the control means, and the control means may output the estimated OCV and/or the estimated SOC of the secondary battery as a graphical interface (a character, a number, a graph, and the like) through the display means.

Also, the above apparatuses for estimating the parameter of the secondary battery may transmit the estimated OCV and/or the estimated SOC of the secondary battery to an external control unit.

Also, the above apparatuses for estimating the parameter of the secondary battery may further a storage means combined with the control means, and the control means may record and/or erase and/or update and/or transmit the plurality of current-voltage data and/or a slope and a Y intercept of the linear approximation equation and/or the lookup table or the lookup function and/or the estimated OCV and/or the estimated SOC into the storage means.

Also, the above apparatuses for estimating the parameter of the secondary battery may be included in various electric-powered devices supplied with energy from the secondary battery.

To achieve the above objects, a method for estimating a parameter of a secondary battery according to one aspect of the present disclosure includes measuring a plurality of current-voltage data while a charging current decreases when a secondary battery is charged in such a pattern that the charging current increases to a peak value and then decreases, calculating a linear approximation equation representing a correlation between a current and a voltage from the plurality of measured current-voltage data, and estimating an OCV of the secondary battery by reflecting a polarization voltage of the secondary battery quantified through an RC circuit on a Y intercept of the linear approximation equation.

To achieve the above objects, a method for estimating a parameter of a secondary battery according to another aspect of the present disclosure includes measuring current-voltage data repeatedly at a time interval while a secondary battery is charged in such a pattern that the charging current increases to a peak value and then decreases, identifying a plurality of current-voltage data measured while the charging current decreases from the peak value, among the measured current-voltage data, calculating a linear approximation equation representing a correlation between a current and a voltage from the plurality of identified current-voltage data, and estimating an OCV of the secondary battery by reflecting a polarization voltage of the secondary battery quantified through an RC circuit on a Y intercept of the linear approximation equation.

Preferably, the method for estimating the parameter of the secondary battery may further include estimating an SOC of the secondary battery from the estimated OCV.

Also, the method for estimating the parameter of the secondary battery may further include storing and/or transmitting and/or displaying the estimated OCV and/or the estimated SOC.

The secondary battery may further include an electrolyte including working ions, and a separator to electrically separate a cathode from an anode and allow the working ions to move. The electrolyte is not limited to a specific type if it includes working ions and may cause an electrochemical oxidation or reduction reaction at a cathode and an anode by the medium of the working ions.

The secondary battery may further include a casing to seal the cathode, the anode, and the separator. The casing does not have special limitation in its material if it has chemical safety.

An outer appearance of the secondary battery is determined by a structure of the casing. The structure of the casing may be one of the various structures known in the art, and typically, may have a cylindrical shape, a prismatic shape, a pouch shape, a coin shape, and the like.

Advantageous Effects

According to the present disclosure, an open-circuit voltage (OCV) and/or a state of charge (SOC) of a secondary battery may be reliably estimated during dynamic charging of the secondary battery. Particularly, for a secondary battery including a blended cathode material showing a unique voltage change pattern, reliable estimation of an OCV and/or an SOC may be achieved as well. Also, even if polarization on an electrode of a secondary battery is accumulated, an OCV and/or an SOC may be estimated accurately. Because the OCV and/or the SOC is estimated using current-voltage data measured in a state of reduced polarization accumulation on the secondary battery, reliability of the estimated parameter may be improved.

DESCRIPTION OF DRAWINGS

The accompanying drawings illustrate a preferred embodiment of the present disclosure and together with the foregoing disclosure, serve to provide further understanding of the technical spirit of the present disclosure, and thus, the present disclosure is not construed as being limited to the drawing.

MODE FOR DISCLOSURE

Figure 1:
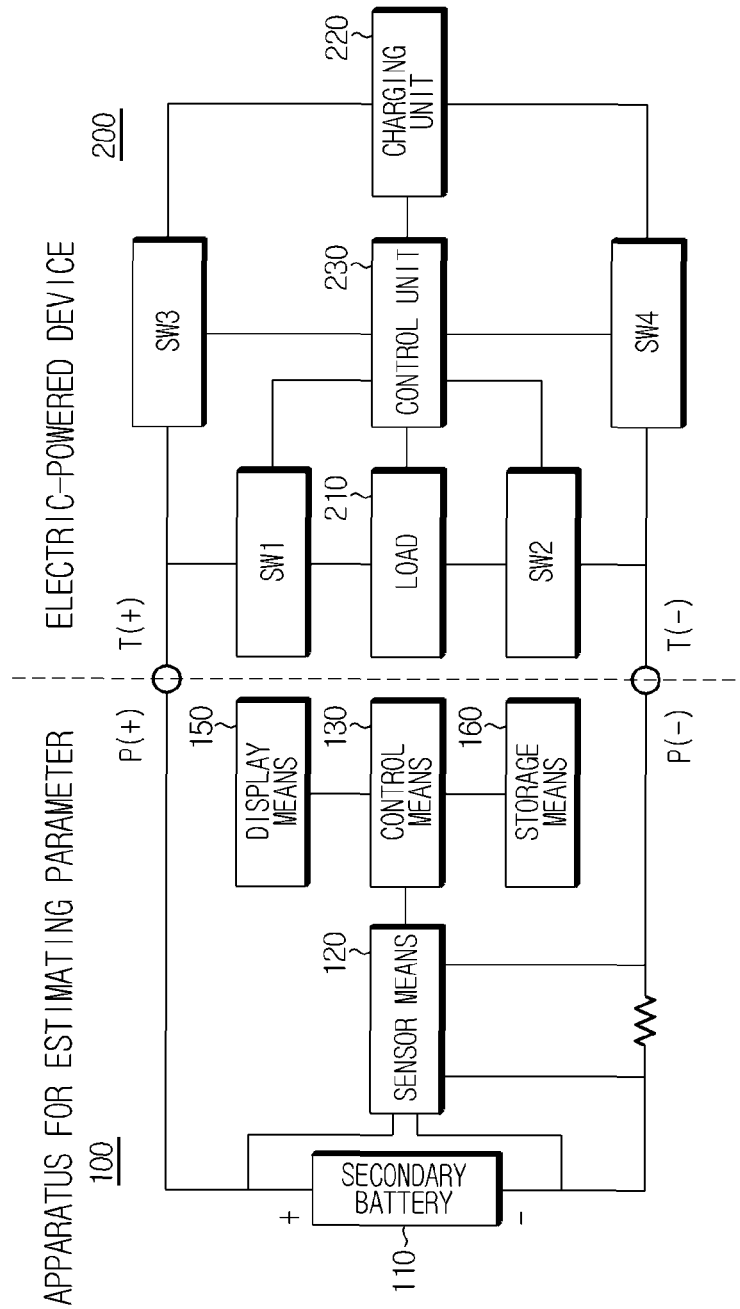
FIG. 1 is a block diagram illustrating construction of an apparatus for estimating a parameter of a secondary battery according to an exemplary embodiment of the present disclosure.

Hereinafter, exemplary embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the disclosure, so it should be understood that other equivalents and modifications could be made thereto without departing from the spirit and scope of the disclosure.

The embodiments described below dictates a case in which the technical aspects of the present disclosure are applied to a lithium secondary battery. Here, a lithium secondary battery is a secondary battery in which lithium ions act as working ions and cause an electrochemical reaction at a cathode and an anode during charging and discharging. The working ions represent ions participating in the electrochemical oxidation and reduction reactions during charging and discharging of the secondary battery, and for example, lithium may work so. Accordingly, any secondary battery using lithium ions as working ions should be construed as being included in the scope of the lithium secondary battery even though the name of the secondary battery changes based on a type of an electrolyte or a separator used in the lithium secondary battery, a type of a casing used to package the secondary battery, an internal or external structure of the lithium secondary battery, and the like.

Also, the present disclosure may be applied to secondary batteries other than a lithium secondary battery. Accordingly, even though working ions are not lithium ions, any secondary battery to which the technical aspects of the present disclosure may be applied should be construed as being included in the scope of the present disclosure regardless of its type. It should be noted that, in certain embodiments in which the term 'secondary battery' is used instead of the term 'lithium secondary battery', a secondary battery in the corresponding embodiments is used as a concept of encompassing various types of secondary batteries.

Also, a secondary battery is not limited to a number of elements constituting the secondary battery. Accordingly, a secondary battery should be construed as including not only a unit cell including an anode, an electrolyte, and a cathode as a basic unit, but also an assembly of unit cells, a module comprising a plurality of assemblies connected in series and/or in parallel, a pack comprising a plurality of modules connected in series and/or in parallel, a battery system comprising a plurality of packs connected in series and/or in parallel, and the like.

FIG. 1 is a block diagram illustrating construction of an apparatus for estimating a parameter of a secondary battery according to an exemplary embodiment of the present disclosure.

Referring to FIG. 1, high and low potential terminals (P+, P−) of the secondary battery 110 are electrically coupled with high and low potential connection terminals (T+, T−) of an electric-powered device 200.

The secondary battery 110 may be a lithium secondary battery, but the present disclosure is not limited by a battery type.

In one embodiment, the electric-powered device 200 may be a mobile computer device such as a mobile phone, a laptop computer, and a tablet computer, or a handheld multimedia device including a digital camera, a video camera, an audio/video player, and the like.

In another embodiment, the electric-powered device 200 may be an electric transport system powered by electricity such as an electric vehicle, a hybrid vehicle, an electric bike, an electric motorcycle, an electric train, an electric boat, an electric aircraft, or a power tool including a motor such as electric drill and an electric grinder.

In still another embodiment, the electric-powered device 200 may be a large capacity energy storage system installed in an electrical grid to store new renewable energy or excess electricity, or an interruptible power supplier to supply power to various information and communication systems including a server computer or mobile communication equipment in case of emergency such as blackout.

The electric-powered device 200 includes a load 210 and/or a charging unit 220.

The load 210 is a device that consumes electrical energy of the secondary battery 110, and as a non-limiting example, may be a rotary drive device such as a motor or a power conversion device such as a converter or an inverter.

The charging unit 220 is a device that applies a charging current to the secondary battery 110, and as a non-limiting example, may be a charging circuit, a generator coupled to an engine of an electric drive vehicle, a regeneration charger coupled to a brake of an electric-powered vehicle, and the like.

The electric-powered device 200 may include a control unit 230 to control operation of the load 210 and/or the charging unit 220. The control unit 230 may include a microcomputer to execute a software algorithm for the control of the electric-powered device 200.

The electric-powered device 200 may also include first through fourth switches SW1-SW4 to selectively connect the secondary battery 110 and the load 210 or the secondary battery 110 and the charging unit 220.

The first and second switches SW1 and SW2 turn on or off an electrical connection between the secondary battery 110 and the load 210 in response to a control signal received from the control unit 230.

The third and fourth switches SW3 and SW4 turn on or off an electrical connection between the secondary battery 110 and the charging unit 220 in response to a control signal received from the control unit 230.

Preferably, the first through fourth switches SW1-SW4 may be a semiconductor switch or a mechanical relay switch.

The control unit 230 turns on or off an electrical connection between the secondary battery 110 and the load 210 or between the secondary battery 110 and the charging unit 220.

In one example, when a state of charge (SOC) of the secondary battery 110 is high, the control unit 230 connects the secondary battery 110 to the load 210 by turning on the first and second switches SW1 and SW2, to operate the load 210 by electrical energy stored in the secondary battery 110. Then, the secondary battery 110 is discharged so that electrical energy is provided to the load 210.

In another example, when an SOC of the secondary battery 110 is low, the control unit 230 connects the secondary battery 110 to the charging unit 220 by turning on the third and fourth switches SW3 and SW4, to apply a charging current to the secondary battery 110. Then, the charging unit 220 applies a charging current to the secondary battery 110.

In still another example, during operation of the load 210, the control unit 230 connects the secondary battery 110 to the load 210, and when the operation of the load 210 is temporarily stopped, may connect the secondary battery 110 to the charging unit 220 to charge the secondary battery 110.

In these embodiments, the control unit 230 may control the charging unit 220 to cause a charging current supplied to the secondary battery 110 to have such a pattern that the charging current increases to a predetermined peak value and then decreases.

As an example, the control unit 230 may control the charging unit 220 to cause a magnitude of a charging current to gradually increase from zero to a predetermined peak value and then gradually decrease to zero.

As another example, the control unit 230 may control the charging unit 220 to cause a magnitude of a charging current to gradually increase from zero to a predetermined peak value and then gradually decrease to zero after a discharging current of the secondary battery 110 gradually decreases to zero.

As a typical example of the above embodiment, regeneration charging of an electric vehicle or a hybrid vehicle may be given. The regeneration charging refers to charging of a secondary battery using regeneration energy produced by a brake system when the vehicle slows down through brake manipulation. Because regeneration charging is made when a brake is manipulated, a discharging current of the secondary battery 110 gradually decreases to zero until regeneration charging starts. Also, during regeneration charging, a magnitude of a charging current gradually increases from zero to a predetermined peak value and then gradually decreases to zero. In this embodiment, the charging unit 220 is systemically coupled with a brake system that produces regeneration energy, and the control unit 230 may control an overall regeneration charging process. Because the regeneration charging technology is widely known in the technical field to which the present disclosure belongs, its detailed description is omitted herein.

The apparatus 100 for estimating the parameter is an apparatus that estimates an electrochemical parameter changing during charging or discharging of the secondary battery 110, such as an open-circuit voltage (OCV) or an SOC of the secondary battery 110, and includes a sensor means 120 and a control means 130.

The sensor means 120 measures a magnitude of a charging current and a voltage of the secondary battery while the charging current is supplied from the charging unit 220 to the secondary battery 110, and provides it to the control means 130.

The sensor means 120 may receive a measurement control signal from the control means 130 to measure a current and a voltage of the secondary battery while a charging current flows. That is, the sensor means 120 measures a current and a voltage of the secondary battery each time the measurement control signal is received, and provides it to the control means 130.

According to one embodiment, while the magnitude of the charging current increases from zero to a predetermined peak value and then decreases to zero, the sensor means 120 measures the magnitude of the charging current and the voltage of the secondary battery 110 repeatedly multiple times at a time interval during the charging current decrease from the predetermined peak value to zero, and provides it to the control means 130.

According to another embodiment, while the magnitude of the charging current increases from zero to the predetermined peak value and then decreases to zero, the sensor means 120 measures the magnitude of the charging current and the voltage of the secondary battery 110 repeatedly multiple times at a time interval, and provides it to the control means 130.

Hereinafter, for convenience of description, the magnitude of the charging current and the voltage of the secondary battery 110 measured at any point in time is referred to as current-voltage data.

In the above embodiments, because the magnitude of the charging current and the voltage of the secondary battery 110 are measured multiple times, the control means 130 receives a plurality of current-voltage data from the sensor means 120.

According to one aspect, the sensor means 120 may measure the magnitude of the charging current and the voltage of the secondary battery 110 multiple times after an operation mode of the secondary battery 110 changes from a discharging mode to a charging mode. In this case, after a discharging current of the secondary battery 110 gradually decreases to zero, the sensor means 120 may measure current-voltage data.

In the above embodiments, the sensor means 120 may measure the current and the voltage of the secondary battery 110 multiple times after the magnitude of the charging current decreases to ⅓ or less, preferably, ⅙ or less, based on the peak value. Also, the decrease ratios are just an example, and may be changed to different numeric values.

The plurality of current-voltage data is used to estimate an OCV and a SOC of the secondary battery 110, and because current-voltage data measured under the above measurement condition is obtained in a state that polarization accumulation of the secondary battery 110 is reduced, reliability of an OCV and a SOC estimated according to the present disclosure may be improved.

The control means 130 controls the operation of the sensor means 120. That is, the control means 130 may transmit a measurement control signal to the sensor means 120 multiple times to measure the current and the voltage of the secondary battery 110 multiple times during charging of the secondary battery 110. Also, the sensor means 120 measures the current and the voltage of the secondary battery 110 in response to the measurement control signal and provides it to the control means 130, and the control means 130 receives it.

After the control means 130 receives the plurality of current-voltage data, the control means 130 calculates a linear approximation equation ($V = a*I + b$) representing a correlation between the current and the voltage using the received current-voltage data.

Here, an input variable I and an output variable V of the linear approximation equation denote a current and a voltage of the secondary battery 110, respectively, a slope 'a' denotes a resistance characteristic, a Y intercept 'b' denotes a voltage when a current of the secondary battery is zero, that is, an OCV. Accordingly, when the linear approximation equation is calculated, the Y intercept may be estimated as an OCV of the secondary battery.

A number of current-voltage data used when calculating the linear approximation equation is preferably at least two. Also, to estimate an OCV more accurately, increasing a number of current-voltage data to at least three is not particularly limited.

Also, assuming that a point in time at which the magnitude of the charging current reaches the peak value is $T_p$ and a point in time at which the magnitude of the charging current decreases from the peak value to zero is $T_0$, it is preferred to select a time to measure the current-voltage data as near to $T_0$ as possible. This is because as the time to measure the current-voltage data is closer to $T_0$, the Y intercept of the linear approximation equation gets closer to an OCV of the secondary battery 110 because the secondary battery 110 is in a state that polarization accumulation of the secondary battery 110 is more reduced.

As an example, the control means 130 acquires extrapolation data used to calculate the linear approximation equation by selecting at least two current-voltage data measured after the magnitude of the charging current decreases to ⅓ or less, preferably, ⅙ or less based on the peak value, among the plurality of current-voltage data received from the sensor means 120. This method is a method of sampling current-voltage data used to calculate the linear approximation equation among the plurality of current-voltage data provided from the sensor means 120. The control unit 130 may calculate the linear approximation equation using the extrapolation data acquired by the above method.

As another example, the control means 130 may receive at least two current-voltage data used to calculate the linear approximation equation from the sensor means 120 by outputting the measurement control signal to the sensor means 120 periodically, after the magnitude of the charging current flowing to the secondary battery 110 decreases to ⅓ or less, preferably, ⅙ or less based on the peak value, to acquire a preset number of current-voltage data through the sensor means 120. The received at least two current-voltage data constitute extrapolation data used to calculate the linear approximation equation. This method is a method of measuring, by the control means 130, a plurality of current-voltage data used to calculate the linear approximation equation directly using the sensor means 120, dissimilar to the sampling method described in the foregoing. The control means 130 may calculate the linear approximation equation using the extrapolation data acquired by the above method.

According to one aspect, after calculating the linear approximation equation, the control means 130 may estimate a Y intercept of the calculated linear approximation equation as an OCV of the secondary battery 110 directly. The OCV of the secondary battery 110 estimated in this way is closely approximate to a true OCV when the secondary battery 110 having been in a no-load state for a sufficient period of time before charging or discharging of the secondary battery 110. This embodiment is useful when polarization on the electrode of the secondary battery 110 was not accumulated much.

According to another aspect, in the case where the secondary battery 110 is a lithium secondary battery, when a dynamic operating time of the secondary battery 110 increases, a polarization voltage is driven in the secondary battery as polarization on the electrode is accumulated. Accordingly, when the polarization voltage is driven in the secondary battery 110, if the Y intercept of the linear approximation equation is estimated as an OCV of the secondary battery directly, a difference with a true OCV occurs due to the polarization voltage. For example, in the case where the secondary battery 110 is used in such a mode that discharging is dominant over charging, the Y intercept value has a lower value than a true OCV of the secondary battery. Accordingly, when the usage time of the secondary battery 110 increases, it is preferred to correct the Y intercept value of the linear approximation equation by quantitatively calculating the driven polarization voltage and estimate the corrected Y intercept as an OCV of the secondary battery 110.

The quantitative calculation of the driven polarization voltage may be implemented through an equivalent circuit model including an equivalent circuit representing the polarization voltage.

Figure 2:
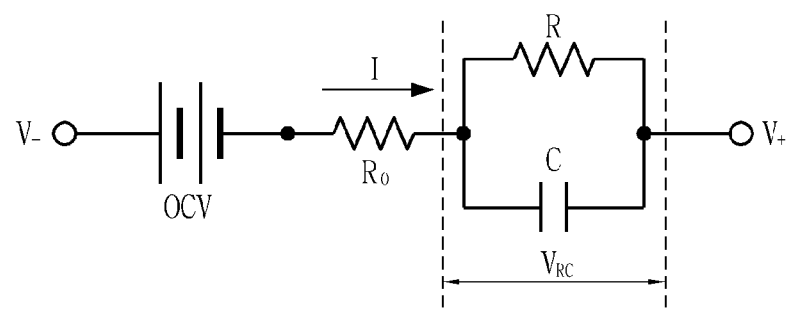
FIG. 2 is a circuit diagram illustrating an embodiment of an equivalent circuit model for a polarization voltage accumulated on an electrode of a secondary battery.

FIG. 2 is a circuit diagram illustrating an equivalent circuit model according to an exemplary embodiment of the present disclosure.

Referring to FIG. 2, the polarization voltage may be represented as voltage applied to a resistor-capacitor (RC) circuit in which a resistance component (R) and a capacitance component (C) are connected in parallel. Here, it is obvious that an equivalent circuit capable of representing the polarization voltage may be replaced by circuits other than an RC circuit.

In the circuit of FIG. 2, series resistance $R_0$ denotes an internal resistance component of the secondary battery 110, and an OCV denotes an open-circuit voltage of the secondary battery 110.

From the circuit shown in FIG. 2, a voltage equation such as Equation 1 may be derived. In the following equation, $V_{cell}$ denotes a dynamic voltage of the secondary battery 110, and an OCV denotes an open-circuit voltage of the secondary battery 110.

$$V_{cell}=V_+-V_-=OCV+IR_0+V_{RC} \qquad \text{<Equation 1>}$$

Meanwhile, the variable $V_{RC}$ at the right side of the above Equation 1 may be represented as the following Equation 2 by a time-discrete equation. Equation 2 corresponds to an equation for calculating voltage formed by an RC circuit, and is an expression known in the technical field to which the present disclosure belongs.

In Equation 2, $\Delta t$ denotes a time taken for voltage of an RC circuit to change from $V_{RC}[k]$ to $V_{RC}[k+1]$. Also, exp[ ] denotes an exponential function of a natural logarithm (e).

$$V_{RC}[k+1]=V_{RC}[k]*\exp[-\Delta t/RC]+R*I(1-\exp[-\Delta t/RC]) \qquad \text{<Equation 2>}$$

An OCV of the secondary battery 110 may be measured when a current flowing through the secondary battery 110 is 0. If this condition is reflected on the Equation 1, the above Equation 1 may be written as the following Equation 3.

$$V_{cell}=OCV+V_{RC} \qquad \text{<Equation 3>}$$

In the above Equation 3, $V_{cell}$ corresponds to a Y intercept of a linear approximation equation. The reason is that in the linear approximation equation, the Y intercept is voltage when a current is 0.

Accordingly, a correction factor for the Y intercept of the linear approximation equation is $V_{RC}$ when a polarization voltage is driven by accumulation of polarization on the electrode of the secondary battery 110, and $V_{RC}$ may be calculated using Equation 2 represented by a time-discrete equation.

In the above Equation 2, a time constant RC and an initial condition $V_{RC}[0]$ may be predetermined through trial and error to guarantee accuracy of correction for the Y intercept within a desired reliability range.

Meanwhile, to improve accuracy of correction for the Y intercept of the linear approximation equation, $V_{RC}$ may be fragmented. That is, because polarization occurs on both a cathode and an anode of a secondary battery when the secondary battery is charged or discharged, $V_{RC}$ may be represented as a sum of a cathode component and an anode component as in the following Equation 4.

$$V_{RC}=V_{RC(+)}+V_{RC(-)} \qquad \text{<Equation 4>}$$

Also, $V_{RC(+)}$ and $V_{RC(-)}$ may be represented as the following Equations 5 and 6 by a time-discrete equation, respectively.

In Equations 5 and 6, $R_+$ and $C_+$ represent resistance and capacitance of a resistor and a condenser included in an RC circuit when representing a polarization voltage accumulated on a cathode as an RC circuit model. Also, R_ and C_ represent resistance and capacitance of a resistor and a condenser included in an RC circuit when representing a polarization voltage accumulated on an anode as an RC circuit model.

$$V_{RC(+)}[k+1]=V_{RC(+)}[k]*\exp[-\Delta t/R_+C_+]+R_+I(1-\exp[-\Delta t/R_+C_+])$$  <Equation 5>

$$V_{RC(-)}[k+1]=V_{RC(-)}[k]*\exp[-\Delta t/R\_C\_]R\_I(1-\exp[-\Delta t/R\_C\_])$$  <Equation 6>

In the above Equations 5 and 6, time constants $R_+C_+$ and $R\_C\_$ and initial conditions $V_{RC(+)}[0]$ and $V_{RC(-)}[0]$ may be predetermined through trial and error to guarantee accuracy of correction for a Y intercept within a desired reliability range.

Figure 3:
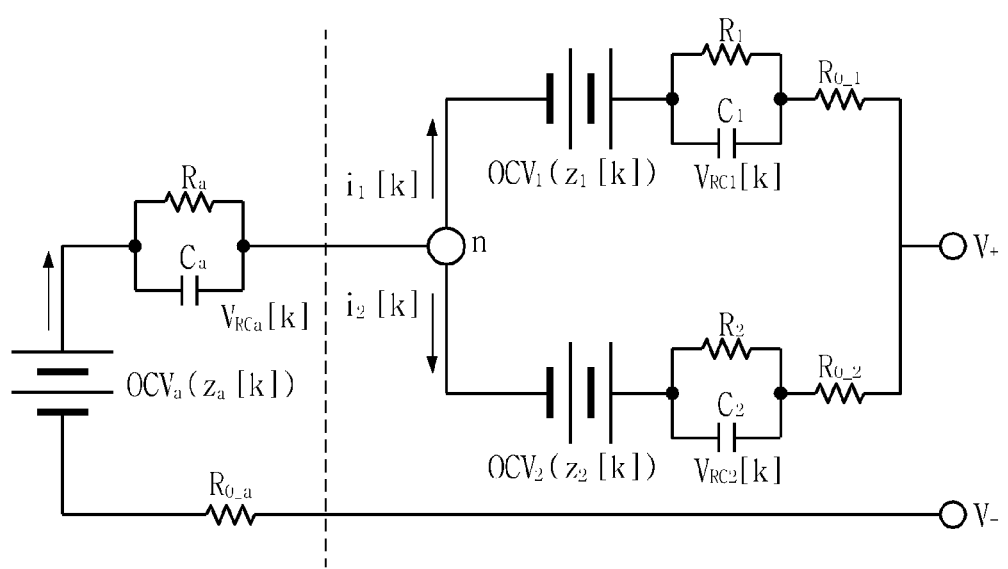
FIG. 3 is a circuit diagram illustrating another embodiment of an equivalent circuit model for a polarization voltage accumulated on an electrode of a secondary battery.

FIG. 3 is a circuit diagram illustrating an equivalent circuit model according to another exemplary embodiment of the present disclosure.

The equivalent circuit model of FIG. 3 may be applied to a case in which a blended cathode material of at least first and second cathode materials is included in the cathode of the secondary battery 110.

Here, the first cathode material reacts with working ions (for example, lithium ions) mainly in a high voltage range, and the second cathode material reacts with working ions mainly in a low voltage range. Accordingly, when the secondary battery including the blended cathode material is charged and discharged, there exists a transition voltage range where a type of a cathode material reacting with working ions changes.

When the secondary battery 110 is charged or discharged in a higher voltage range than the transition voltage range, the working ions may be deintercalated from the first cathode material or the working ions may be intercalated into the first cathode material. In contrast, when the secondary battery 110 is charged or discharged in a lower voltage range than the transition voltage range, the working ions may be deintercalated from the second cathode material or the working ions may be intercalated into the second cathode material.

Meanwhile, if the secondary battery 110 is charged in the transition voltage range, almost the whole working ions has been deintercalated from the second cathode material so that the working ions start to be deintercalated from the first cathode material rather than the second cathode material. In the event of this phenomenon, a voltage profile of the secondary battery 110 measured over time has a gradually increasing pattern while forming an inflection point. When a type of a cathode material from which working ions are deintercalated changes, resistance characteristics of the secondary battery change, and thus, even though the same charging current flows, a voltage change amount varies. Its description will be provided later through an experimental example.

In the circuit of FIG. 2, $i_1$ and $i_2$ indicate an electric current flowing through the first cathode material and/the second cathode material in the equivalent circuit model, respectively. When the secondary battery is charged or discharged at a higher voltage than the transition voltage range, $i_2$ may be set to 0. Also, when the secondary battery is charged or discharged at a lower voltage than the transition voltage range, $i_1$ may be set to 0. The direction of the electric current shown in the drawing shows a situation in which the secondary battery is discharged, and in the case where the secondary battery is charged, the direction of the electric current is opposite to the shown direction.

The circuit at the side of the cathode includes two RC circuits, and the upper one models a polarization voltage formed on the first cathode material, and the lower one models a polarization voltage formed on the second cathode material. Similarly, an RC circuit included in the circuit at the side of the anode models a polarization voltage formed on the anode material. The series resistance components included at the side of the cathode and the anode are results of modeling resistance components present in each electrode material.

The voltage $V_{cell}$ of the secondary battery corresponds to a difference between $V_+$ and $V_-$, and because an equation for $V_{cell}$ may be derived from Kirchhoff voltage and current laws and the voltage applied to the RC circuit may be represented by a time-discrete equation, the correction factor for the Y intercept of the linear approximation equation that may be calculated during charging of the secondary battery 110 may be obtained by a simple arithmetical calculation.

As an embodiment, when charging is completed after the secondary battery 110 are charged in the voltage range in which the working ions are mainly inserted into the first cathode material, under such condition, the voltage $V_{cell}$ of the secondary battery 110 may be represented by the following Equation 7. For reference, when charging is completed, all the electric current flowing through the equivalent circuit becomes 0, and thus, the voltage formed in the series resistance becomes all 0.

$$V_{cell}=(OCV_1-OCV_a)+V_{RC1}[k]+V_{RCa}[k]=OCV_{cell}+V_{RC1}[k]+V_{RCa}[k]$$  <Equation 7>

Accordingly, when the secondary battery 110 includes the blended cathode material, and charging is completed after the secondary battery is charged in the voltage range in which the first cathode material reacts with the working ions, the correction factor for the Y intercept of the linear approximation equation is "$V_{RC1}[k]+V_{RCa}[k]$". That is, the correction factor of the Y intercept may be represented as a sum of polarization voltage components driven on the first cathode material and the anode.

Here, the charging condition may as above be established in the case where charging is completed after the secondary battery 110 is charged at a higher voltage than the transition voltage range, or in the case where charging is terminated after the secondary battery 110 is charged until an inflection point appears in the transition voltage range.

Meanwhile, in the case where the secondary battery 110 includes the blended cathode material, when the secondary battery 110 is charged in the transition voltage range, an inflection point may appear in the voltage profile. In this case, when calculating the linear approximation equation, it is preferred to use current-voltage data measured after the emergence of the inflection point as extrapolation data.

When the OCV of the secondary battery 110 is estimated using the Y intercept of the linear approximation equation, the control means 130 may further estimate an SOC of the secondary battery 110 using the estimated OCV. Here, the estimated OCV may be the Y intercept itself, or the Y intercept corrected by the correction factor.

In one embodiment, the control means 130 may further estimate an SOC of the secondary battery corresponding to the estimated OCV using a predefined lookup table or lookup function that predefines a correlation between the estimated OCV and the SOC.

Here, the lookup table is made by measuring an SOC for each OCV of the secondary battery 110 through an experiment, and organizing the measurement results in a form of a table. From the lookup table, an SOC of the secondary battery 110 may be estimated in a simple manner by mapping the estimated OCV to a corresponding SOC.

The lookup function is presented by measuring an SOC for each OCV of the secondary battery 110 through an experiment, and defining a profile of the measured SOCs as a function. An input variable and an output variable of the lookup function are the OCV and the SOC, respectively. When the estimated OCV is substituted as an input variable of the lookup function, the SOC may be obtained as an output value of the lookup function.

Meanwhile, the SOC of the secondary battery 110 may have dependency on temperature. Accordingly, a temperature parameter may be further added to the lookup table and the lookup function. That is, through an experiment, the lookup table and the lookup function may be prepared for each temperature. In this case, when a charging current flows to the secondary battery 110, the sensor means 120 may further measure a temperature of the secondary battery 110 and provide the temperature of the secondary battery 110 to the control means 130. Then, the control means 130 may identify a lookup table or lookup function corresponding to the temperature of the secondary battery 110, and may estimate an SOC of the secondary battery 110 corresponding to the estimated OCV using the identified lookup table or lookup function.

The apparatus 100 for estimating the parameter of the secondary battery may further include a storage means 160. The storage means 160 is not limited to a specific type if it is a storage medium capable of recording and erasing information.

As an example, the storage means 160 may be random access memory (RAM), read-only memory (ROM), a register, a hard disc, an optical recording medium, or a magnetic recording medium. Also, the storage means 160 may be connected to the control means 130 via, for example, a data bus, to allow access by the control means 130.

The storage means 160 may store and/or update and/or erase and/or transmit programs including various control logics executed by the control means 130, and/or data generated by execution of the control logics.

The storage means 160 may be logically divided into at least two, and is not limited as being included in the control means 130.

The storage means 160 may maintain the plurality of current-voltage data measured by the sensor means 120, the extrapolation data including the at least two current-voltage data used in calculating the linear approximation equation, or the parameter (the OCV and/or the SOC) estimated using the linear approximation equation.

To execute various control logics and/or calculation logics, the control means 130 may optionally include a processor, an application-specific integrated circuit (ASIC), a chipset, a logic circuit, a register, a communication modem, and a data processing device, well known in the art. Also, when the control logic is implemented in software, the control means 130 may be implemented as an assembly of program modules. In this instance, the program module may be stored in a memory and executed by a processor. The memory may be disposed inside or outside a processor, and may be connected to a processor by various known means. Also, the memory may be included in the storage means 160. Also, the memory generally represents all devices storing information regardless of a device type, and does not indicate a specific memory device.

Optionally, the apparatus 100 for estimating the parameter of the secondary battery may further include a display means 150. The display means 150 is not limited to a specific type if it can display information about the OCV and/or the SOC of the secondary battery 110 estimated by the control means 130 as graphical interface (a character, a number, a graph, and the like).

As an example, the display means 150 may be a liquid crystal display (LCD), a light-emitting diode (LED) display, an organic light-emitting diode (OLED) display, an electrophoretic ink (E-Ink) display, a flexible display, and the like.

The display means 150 may be connected with the control means 130 directly or indirectly. When the latter is employed, the display means 150 may be located in a physically separate area from an area where the control means 130 is located. Also, a third control means (not shown) may be interposed between the display means 150 and the control means 130 to receive information to be displayed on the display means 150 from the control means 130 and allow the information to be displayed on the display means 150. For this, the third control means may be connected to the control means 130 via a communication line (for example, a CAN communication network in a vehicle).

The display means 150 is not necessarily included in the apparatus according to the present disclosure, and may be included in other apparatus connected with the apparatus according to the present disclosure. In this case, the display means 150 and the control means 130 may be indirectly connected via a control means included in other apparatus rather than being directly connected. Accordingly, it should be understood that an electrical connection of the display means 150 and the control means 130 includes this indirect connection method.

The control means 130 may form a communication interface with an external control device. Also, through the communication interface, data associated with the OCV and/or the SOC of the secondary battery 110 may be transmitted to the external control means. The external control means may be a control unit 230 of the electric-powered device 200.

As an example, in the case where the secondary battery 110 is mounted in an electric vehicle, the control means 130 may transmit data associated with the OCV and/or the SOC of the secondary battery 110 to the control unit 230 that controls an operating mechanism of the electric vehicle in an integrated manner. Then, the control unit 230 may control the charge and discharge of the secondary battery 110 using the received OCV and/or SOC of the secondary battery 110, and maximize the usage efficiency of the secondary battery 110.

In the present disclosure, the secondary battery 110 includes a cathode active material and an anode active material, and the cathode active material may be a single cathode material or a blended cathode material including at least two cathode materials.

In the latter case, the blended cathode material may include a first cathode material and a second cathode material, each having a different reaction concentration with working ions depending on a voltage level of the secondary battery or different operating voltage ranges.

As an example, the first cathode material reacts with working ions in a high voltage range, and the second cathode material reacts with working ions in a low voltage range.

According to one aspect, the first cathode material may be an alkali metal compound represented by a general chemical formula $A[A_xM_y]O_{2+z}$ (A includes at least one of Li, Na, and K; M includes at least one element selected from Ni, Co, Mn, Ca, Mg, Al, Ti, Si, Fe, Mo, V, Zr, Zn, Cu, Al, Mo, Sc, Zr, Ru, and Cr; $x≥0$, $1≤x+y≤2$, $-0.1≤z≤2$; a stoichiometric coefficient x, y, z, and a stoichiometric coefficient of an element included in M is selected such that a compound maintains electrical neutrality), or an alkali metal compound, disclosed in U.S. Pat. No. 6,677,082 and U.S. Pat. No. 6,680,143, $xLiM^1O_2-(1-x)Li_2M^2O_3$ ($M^1$ includes at least one element having an average oxidation state equal to 3; $M^2$ includes at least one element having an average oxidation state equal to 4; $0 \le x \le 1$).

According to another aspect, the second cathode material may be lithium metal phosphate represented by a general chemical formula $Li_aM^1_xFe_{1-x}M^2_yP_{1-y}M^3_zO_{4-z}$ ($M^1$ includes at least one element selected from Ti, Si, Mn, Co, Fe, V, Cr, Mo, Ni, Nd, Al, Mg, and Al; $M^2$ includes at least one element selected from Ti, Si, Mn, Co, Fe, V, Cr, Mo, Ni, Nd, Al, Mg, As, Sb, Si, Ge, V, and S; $M^3$ includes at least one element selected from elements in a halogen family including F; $0<a \le 2$, $0 \le x \le 1$, $0 \le y<1$, $0 \le z<1$; a stoichiometric coefficient a, x, y, z, and a stoichiometric coefficient of an element included in $M^1$, $M^2$, and $M^3$ is selected such that a compound maintains electrical neutrality) or $Li_3M_2(PO_4)_3$ [M includes at least one element selected from Ti, Si, Mn, Fe, Co, V, Cr, Mo, Ni, Mg, and Al].

According to still another aspect, the first cathode material may be $Li[Li_aNi_bCo_cMn_dO_{2+e}][a \ge 0; a+b+c+d=1$; at least one of b, c, and d is not zero; $-0.1 \le z \le 2$], and the second cathode material may be $LiFePO_4$, $LiMn_xFe_yPO_4(0<x+y \le 1)$ or $Li_3Fe_2(PO_4)_3$.

According to yet another aspect, the first cathode material and/or the second cathode material may include a coating layer. The coating layer may include a carbon layer, or may include an oxide layer or a fluoride layer including at least one element selected from the group consisting of Ti, Si, Mn, Co, Fe, V, Cr, Mo, Ni, Nd, Al, Mg, Al, As, Sb, Si, Ge, V, and S.

In the present disclosure, a type and a blend ratio of the first cathode material and the second cathode material is selected such that a convex pattern (an inflection point is present before and after a peak) appears in a discharge resistance profile measured for each SOC of the secondary battery 110, or at least one inflection point appears in an OCV profile measured for each depth of discharge (DoD) of the secondary battery 110, while considering the purpose of use and performance of a secondary battery to be manufactured.

In one embodiment, in the case where a secondary battery with high discharge output is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 5:5.

In another embodiment, in the case where a secondary battery with high-temperature stability is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 2:8.

In still another embodiment, in the case where a low cost secondary battery is desired, $Li[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 1:9.

In yet another embodiment, in the case where a secondary battery with high discharge output and high-temperature stability is desired, $[Ni_{1/3}Mn_{1/3}Co_{1/3}]O_2$ and $LiFePO_4$ may be selected as the first cathode material and the second cathode material, respectively, and a blend ratio of the first cathode material and the second cathode material may be set to 4:6.

In further another embodiment, in the case where a secondary battery with high capacity per weight is desired, $Li[Ni_{0.5}Mn_{0.3}Co_{0.2}]O_2$ and $LiFePO_4$ may be selected as the first cathode material and the second cathode material, respectively, and a blend ratio of the first cathode material and the second cathode material may be set to 9:1.

Methods of selecting the first cathode material and the second cathode material and adjusting the blend ratio are just one example. Accordingly, it is obvious to a person having ordinary skill in the art that the first cathode material and the second cathode material and the blend ratio thereof may be properly selected in consideration of a relative weight and balance of electrochemical properties with which a blended cathode material is characterized.

In the present disclosure, a number of cathode materials that may be included in the blended cathode material are not limited to two. As an embodiment, the blended cathode material may include three different cathode materials, for example, a blended cathode material including $LiMn_2O_4$, $Li[Li_aNi_xCo_yMn_zO_2[a \ge 0; x+y+z=1$; at least one of x, y, and z is not zero], and $LiFePO_4$. As another embodiment, the blended cathode material may include four different cathode materials, for example, a blended cathode material including $LiNiO_2$, $LiMn_2O_4$, $Li[Li_aNi_xCo_yMn_zO_2[a \ge 0; x+y+z=1$; at least one of x, y, and z is not zero], and $LiFePO_4$.

Also, to enhance the properties of the blended cathode material, other additives, for example, a conductive material, a binder, and the like, may be added to the blended cathode material, and there is no particular limitation thereto. Accordingly, any blended cathode material including at least two cathode materials may be construed as being included in the scope of the present disclosure regardless of a number of cathode materials and the presence of other additives.

In the description of various embodiments of the present disclosure, it should be understood that elements called 'means' are distinguished functionally rather than physically. Accordingly, each element may be selectively integrated with other element, or each element may be divided into sub-elements for efficient execution of the control logic(s). However, it is obvious to a person having ordinary skill in the art that even though elements are integrated or divided, if functions are found to be identical, the integrated or divided elements should be construed as falling within the scope of the present disclosure.

A selective combination of at least one of the various control logics and/or calculation logics of the control means 130 may become an embodiment of a method for estimating the parameter of the secondary battery according to the present disclosure.

Figure 4:
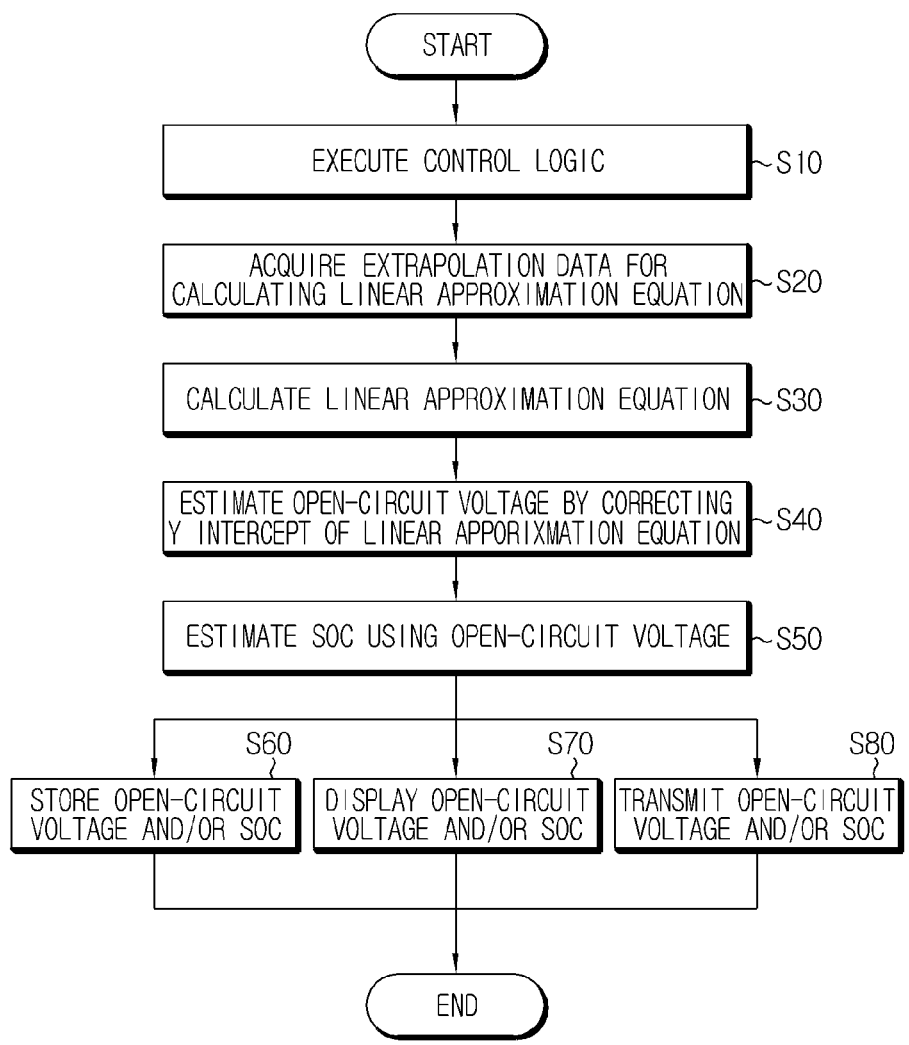
FIG. 4 is a flowchart chronologically illustrating a method for estimating a parameter of a secondary battery according to an exemplary embodiment of the present disclosure.

FIG. 4 is a flowchart chronologically illustrating a method for estimating a parameter of a secondary battery according to an exemplary embodiment of the present disclosure.

First, in S10, the control means 130 reads control logic needed to estimate a parameter of a secondary battery from the storage means 160 and executes the control logic.

Subsequently, in S20, the control means 130 acquires at least two current-voltage data (extrapolation data) used to calculate a linear approximation equation by controlling the sensor means 120 while the secondary battery is temporarily being charged in such a pattern that a charging current increases to a peak value and then reduces.

Preferably, in order to acquire current-voltage data measured when polarization accumulation of the secondary battery 110 is reduced, the control means 130 acquires at least two current-voltage data (extrapolation data) used to calculate a linear approximation equation by controlling the sensor means 120, when a discharging current of the secondary battery 110 in a discharged state gradually decreases to zero and the secondary battery 110 is switched to a charging mode.

Here, the control means 130 acquires extrapolation data by a sampling method or a direction measurement method. Its detailed description is provided above.

Preferably, the current-voltage data included in the extrapolation data may be current-voltage data measured while the magnitude of the charging current decreases from the peak value to zero.

As an example, the current-voltage data included in the extrapolation data may be current-voltage data measured after the magnitude of the charging current decreases to ⅓ or less, preferably, ⅙ or less, based on the peak value. Also, the magnitude condition of the charging current under which the current-voltage data is measured may change based on a type or performance of the secondary battery.

Meanwhile, in case in which the secondary battery 110 includes a blended cathode material, if the secondary battery 110 is charged in a transition voltage range, a voltage profile has an increasing pattern while forming an inflection point. In the case where an inflection point appears in the voltage profile, it is preferred to use, as extrapolation data, current-voltage data measured after the emergence of the inflection point.

Next, in S30, the control means 120 calculates a linear approximation equation using the extrapolation data. Subsequently, in S40, the control means 120 estimates an OCV of the secondary battery by correcting a Y intercept of the linear approximation equation.

That is, when polarization is accumulated on an electrode of the secondary battery 110, an error occurs between the Y intercept of the linear approximation equation and the OCV of the secondary battery 110. This is because when polarization is accumulated, a polarization voltage is driven in the secondary battery 110 due to the polarization. Accordingly, the control means 120 may quantify the polarization voltage caused by the accumulation of polarization using an equivalent circuit model (see FIG. 2 or 3) including an RC circuit, and estimate the OCV by correcting the Y intercept using the quantified polarization voltage. Because a method of correcting the Y intercept is described in detail with reference to the equations, a repeated description is omitted herein.

Subsequently, in S50, the control means 130 may further estimate an SOC of the secondary battery 110 from the estimated OCV. The SOC of the secondary battery 110 may be calculated using a lookup table or a lookup function, as described in the foregoing.

In the case where a temperature of the secondary battery 110 is taken into consideration when estimating the SOC of the secondary battery 110, the flowchart of FIG. 4 may further include a step of acquiring, by the control means 130, data associated with the temperature of the secondary battery 110 using the sensor means 120 during charging of the secondary battery 110. In the case where the temperature of the secondary battery 110 is considered, a detailed description of a method of estimating the SOC by the control means 130 is provided above.

Also, the flowchart of FIG. 4 may further include, as an optional step, at least one step among steps S60 through S80.

That is, in S60, the control means 130 may record the estimated OCV and/or the estimated SOC of the secondary battery 110 in the storage means 160. Also, in S70, the control means 130 may output the estimated OCV and/or the estimated SOC of the secondary battery 110 as graphical interface (a character, a number, a graph, and the like) through the display means 150. Also, the control means 130 may transmit the estimated OCV and/or the estimated SOC of the secondary battery 110 to the control unit 230 of the electric-powered device 200.

In the present disclosure, at least one of various control logics and/or calculation logics of the control means 130 may be selectively combined, and the combined control logics may be written in a computer-readable code and recorded in a computer-readable recording medium.

The recording medium is not limited to a specific type if it is accessible by a processor included in a computer. As an example, the recording medium may include at least one selected from the group consisting of ROM, RAM, a register, a compact disc read-only memory (CD-ROM), a magnetic tape, a hard disc, a floppy disc, and an optical data recording device.

Also, the computer-readable code may be modulated to a carrier signal and included in a communication carrier at a particular point in time, and may be distributed over network-coupled computer systems so that the computer-readable code is stored and executed in a distributed fashion. Also, functional programs, codes, and code segments for implementing the combined control logics may be easily inferred by programmers in the technical field to which the present disclosure belongs.

MODE FOR EMBODIMENT OF THE INVENTION

Hereinafter, a more detailed description of the present disclosure is provided through an experiment example. However, the experiment example is for illustrative of the present disclosure only, and the scope of the present disclosure is not limited thereto.

Experiment Example 1

Fabrication of Secondary Battery

A secondary battery including a single cathode material was fabricated in accordance with the following specification.

Figure 5:
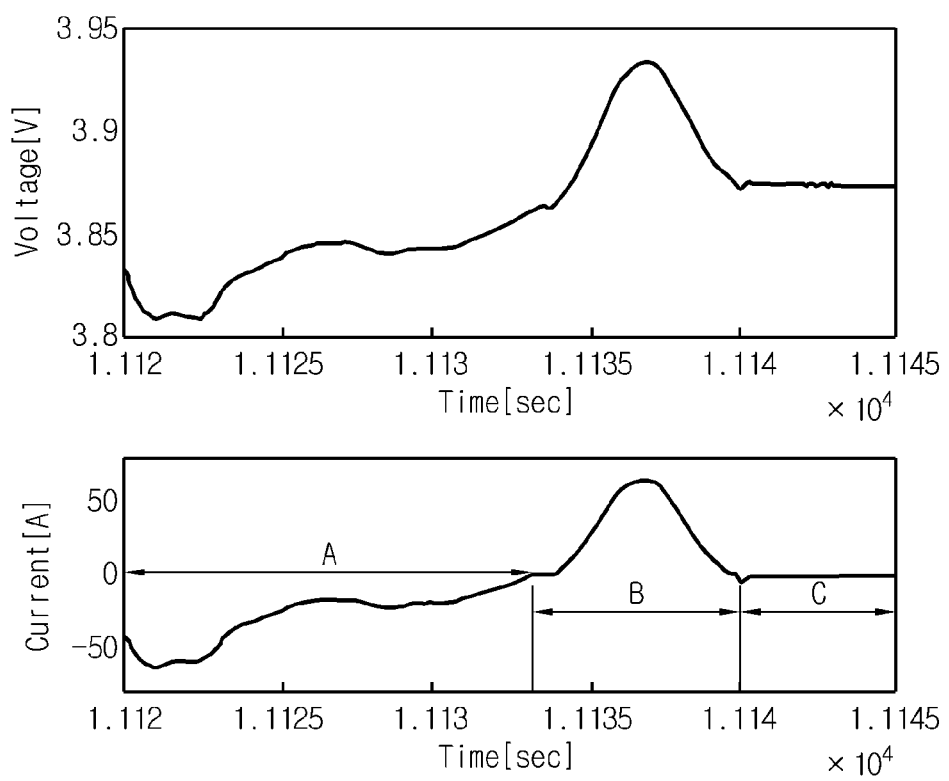
FIG. 5 is a graph illustrating measurements of a charging/discharging current profile and a voltage change profile of a secondary battery (experiment example 1).

Cathode material: $LiCo_{1/3}Ni_{1/3}M_{1/3}O_2$
Anode material: Graphite
Electrolyte: $LiPF_6$ added to a mixed solvent of EC(Ethyl Carbonate)/DMC(DiMethyl Carbonate)/EMC(Ethyl-Methyl Carbonate) mixed at a weight ratio of 3:4:3
Separator: Porous polyolefin film coated with inorganic particles on both surfaces
Casing: Pouch casing
Charge/Discharge Experiment FIG. 5 is a graph illustrating measurements of a charging/discharging current profile and a voltage change of a secondary battery.

The charging/discharging current profile simulates a driving pattern in Los Angeles used as vehicle testing standards in the U.S. hybrid vehicle industry under the assumption that the secondary battery is used in a hybrid vehicle.

In the charging/discharging current profile, a section A is a period during which the secondary battery is discharged, a section B is a period during which the secondary battery is charged, and a section C is a period during which charge and discharge of the secondary battery is stopped. A charging current profile of the section B simulates a situation in which the secondary battery is regeneration charged when the hybrid vehicle slows down by breaking. Accordingly, the charging current profile of the section B has such a pattern that a magnitude of a charging current increases from zero to a predetermined peak value and then decreases to zero. An increase in charging current occurs when a brake is pushed, and a decrease in charging current occurs when a brake is pulled.

Figure 6:
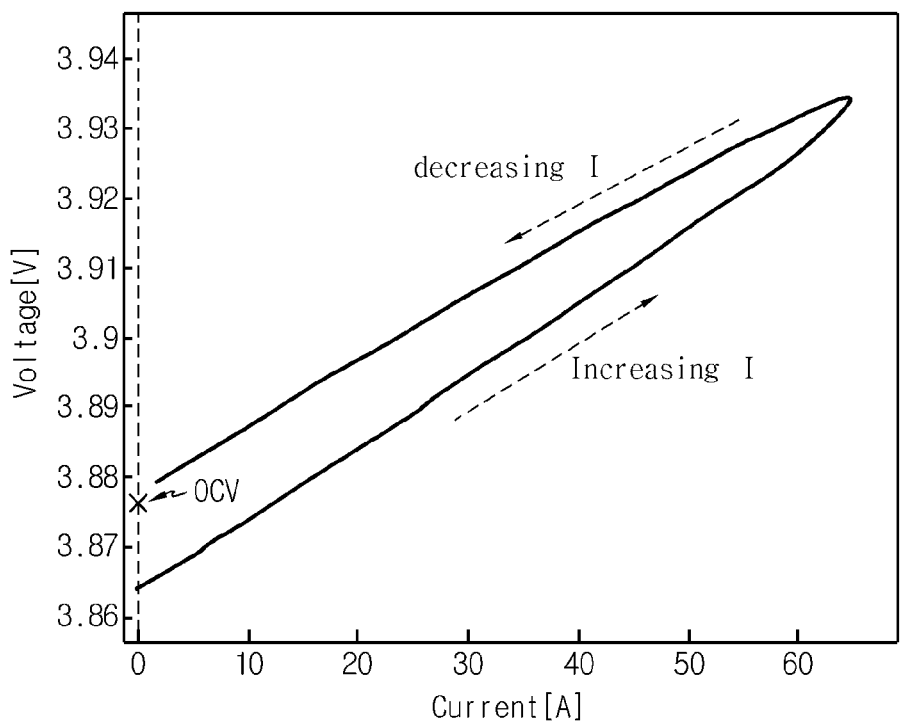
FIG. 6 is a graph plotting current-voltage data of a secondary battery measured during charging of the secondary battery (experiment example 1).

FIG. 6 is a graph plotting current-voltage data of the secondary battery measured during charging of the secondary battery. Referring to FIG. 6, current-voltage data is plotted as a profile having a form of a hysteresis loop, and it is found that current-voltage data measured for a period during which a magnitude of a charging current decreases from a peak value to zero is closely approximate to a true OCV (a point indicated by X) of the secondary battery.

Experiment Example 2

Fabrication of Secondary Battery

A secondary battery including a blended cathode material was fabricated in accordance with the following specification.
Cathode material: Blended cathode material of $LiCo_{1/3}Ni_{1/3}Mn_{1/3}O_2$ and $LiFePO_4$ at a weight ratio of 7:3
Anode material: Graphite
Electrolyte: $LiPF_6$ added to a mixed solvent of EC/DMC/EMC mixed at a weight ratio of 3:4:3
Separator: Porous polyolefin film coated with inorganic particles on both surfaces
Casing: Pouch casing
Observation of Characteristics of Secondary Battery During charging of the secondary battery, lithium ions deintercalated from the cathode material are intercalated into the anode material. However, $LiCo_{1/3}Ni_{1/3}Mn_{1/3}O_2$ and $LiFePO_4$ differ in concentration at which lithium ions are deintercalated as a charging voltage of the secondary battery changes. That is, for a low voltage charging period, lithium ions are deintercalated from $LiFePO_4$, and for a high voltage charging period, lithium ions are deintercalated from $LiCo_{1/3}Ni_{1/3}Mn_{1/3}O_2$. Accordingly, in a transition voltage range, a type of the cathode material from which lithium ions are deintercalated changes from $LiFePO_4$ to $LiCo_{1/3}Ni_{1/3}Mn_{1/3}O_2$.

Occurrence of this phenomenon can be seen indirectly through an inflection point appearing in a voltage profile measured during charging of the secondary battery. The reason that the inflection point appears is that when a cathode material involved in a deintercalation reaction of lithium ions changes, an internal resistance of the secondary battery changes, and as a result, a voltage change amount changes even though a same magnitude of a charging current flows through the secondary battery.

Figure 7:
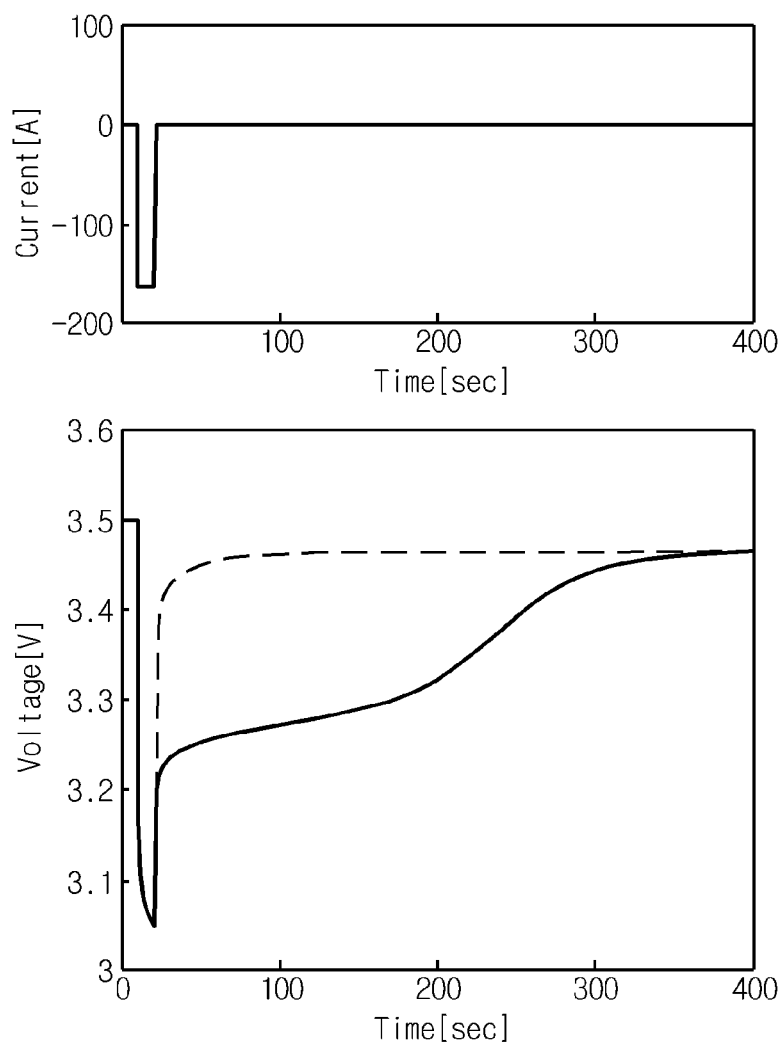
FIG. 7 is a graph illustrating measurements of a charging/discharging current profile and a voltage change profile of a secondary battery (experiment example 2).

FIG. 7 is a graph illustrating measurements of a charging/discharging current profile and a voltage change profile of the secondary battery.

Referring to the drawing, after the secondary battery is discharged for an interval between 10 sec and 20 sec, the secondary battery is charged with a constant current from 20 sec, and an inflection point (see a dotted circle) is observed in a voltage profile measured from 20 sec. A dotted line profile is a voltage change profile of a secondary battery using only $LiCo_{1/3}Ni_{1/3}Mn_{1/3}O_2$ as a cathode material. The dotted line profile makes a great contrast with a solid line profile.

Around the inflection point, a voltage change rate changes suddenly. Accordingly, it can be seen that in a voltage range around the inflection point, a cathode material from which lithium ions are deintercalated changes from $LiFePO_4$ to $LiCo_{1/3}Ni_{1/3}Mn_{1/3}O_2$. The voltage range in which the inflection point appears may change based on a type and a blend ratio of cathode materials constituting the blended cathode material.

A secondary battery including a blended cathode material of at least two cathode materials exhibits a unique behavior in a discharge resistance profile and an OCV profile.

Figure 8:
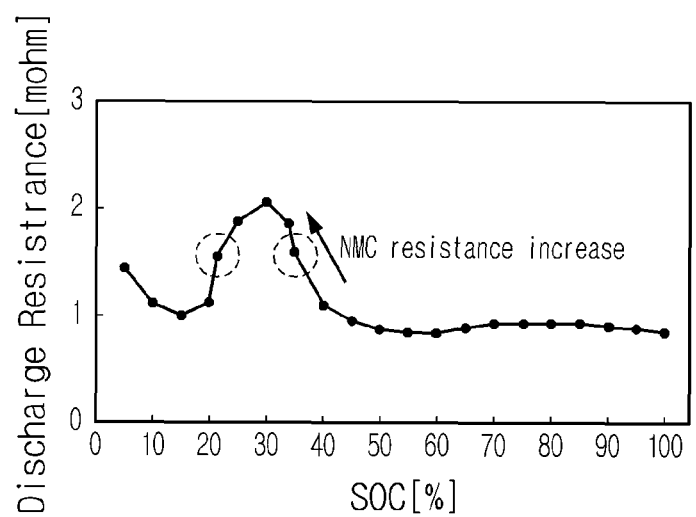
FIGS. 8 and 9 are graphs illustrating a discharge resistance profile of a secondary battery measured for each state of charge (SOC) of the secondary battery and an open-circuit voltage (OCV) profile measured for each depth of discharge (DoD) of the secondary battery, respectively (experiment example 2).
Figure 9:
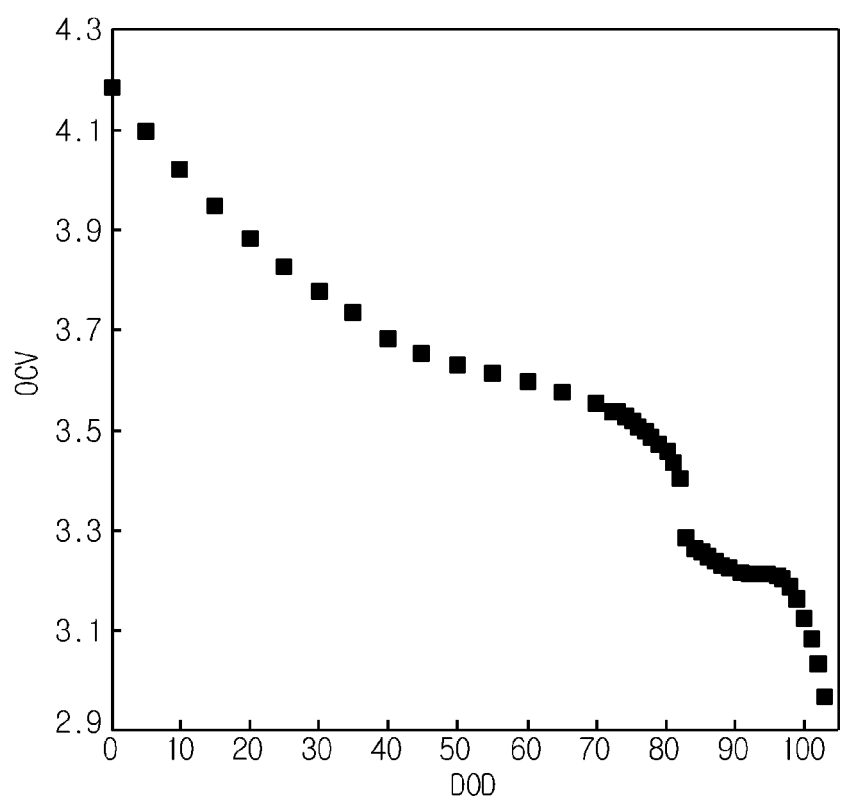

FIGS. 8 and 9 are graphs illustrating a discharge resistance profile of a secondary battery including a blended cathode material, measured for each SOC of the secondary battery, and an OCV profile measured for each DoD of the secondary battery, respectively.

In the drawings, an SOC stands for a state of charge, a DOD stands for a depth of discharge, and numerically, a DOD corresponds to (1-SOC).

Referring to FIG. 8, it can be observed that a convex pattern in which a discharge resistance of the secondary battery locally increases and then decreases appears, and two inflection points (see dotted circles) are present before and after a peak of the convex pattern. Also, referring to FIG. 9, an inflection point is also observed in an OCV profile.

As shown, the reason that the convex pattern and the inflection point are observed in the discharge resistance profile and the OCV profile, respectively, is that internal resistance characteristics of the secondary battery change with a change in type of a cathode material from which lithium ions are deintercalated when the secondary battery is charged.

Charge/Discharge Experiment

Figure 10:
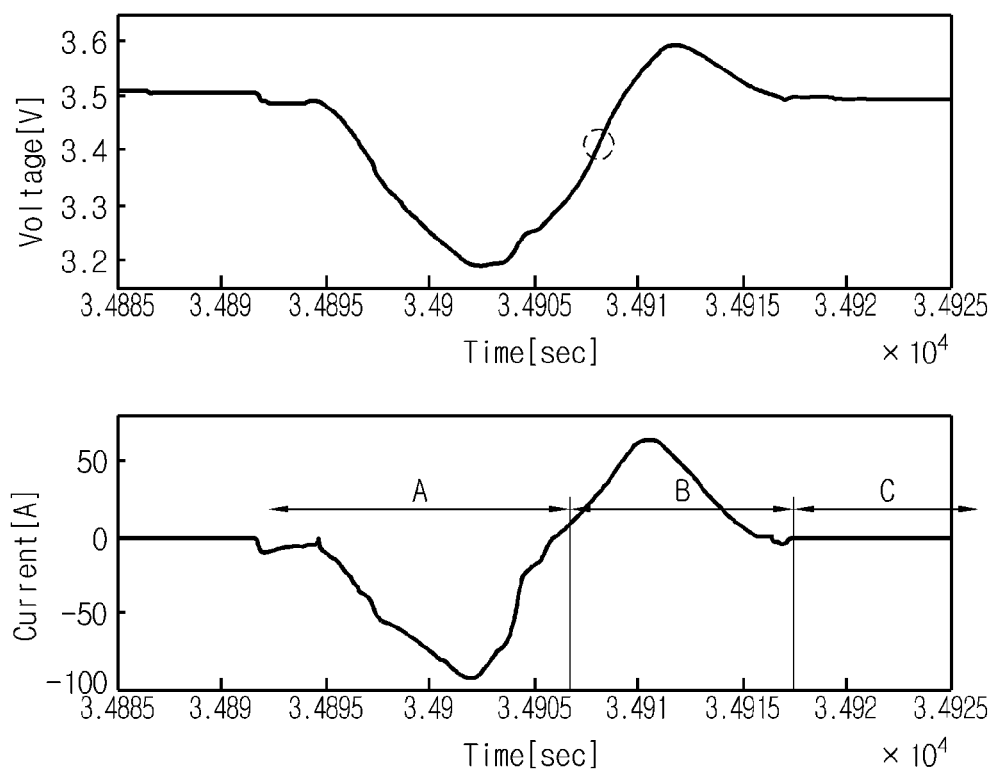
FIG. 10 is a graph illustrating measurements of a charging/discharging current profile of a secondary battery including a blended cathode material and a voltage change of the secondary battery (experiment example 2).

FIG. 10 is a graph illustrating measurements of a charging/discharging current profile of a secondary battery including a blended cathode material and a voltage change of the secondary battery.

The charging/discharging current profile simulates a driving pattern in Los Angeles used as vehicle testing standards in the U.S. hybrid vehicle industry under the assumption that the secondary battery is used in a hybrid vehicle.

In the charging/discharging current profile, a section A is a period during which the secondary battery is discharged, a section B is a period during which the secondary battery is charged, and a section C is a rest period during which charge and discharge of the secondary battery is stopped. A charging current profile of the section B simulates a situation in which the secondary battery is regeneration charged when the hybrid vehicle slows down by breaking. Accordingly, the charging current profile of the section B has such a pattern that a magnitude of a charging current increases from zero to a predetermined peak value and then decreases to zero.

Referring to the voltage change of FIG. 10, an inflection point (dotted circle) is observed in a voltage profile of the secondary battery corresponding to the section B. Accordingly, it is found that during charging in the section B, a cathode material from which lithium ions are deintercalated changes from $LiFePO_4$ to $LiCo_{1/3}Ni_{1/3}Mn_{1/3}O_2$ around the inflection point.

Figure 11:
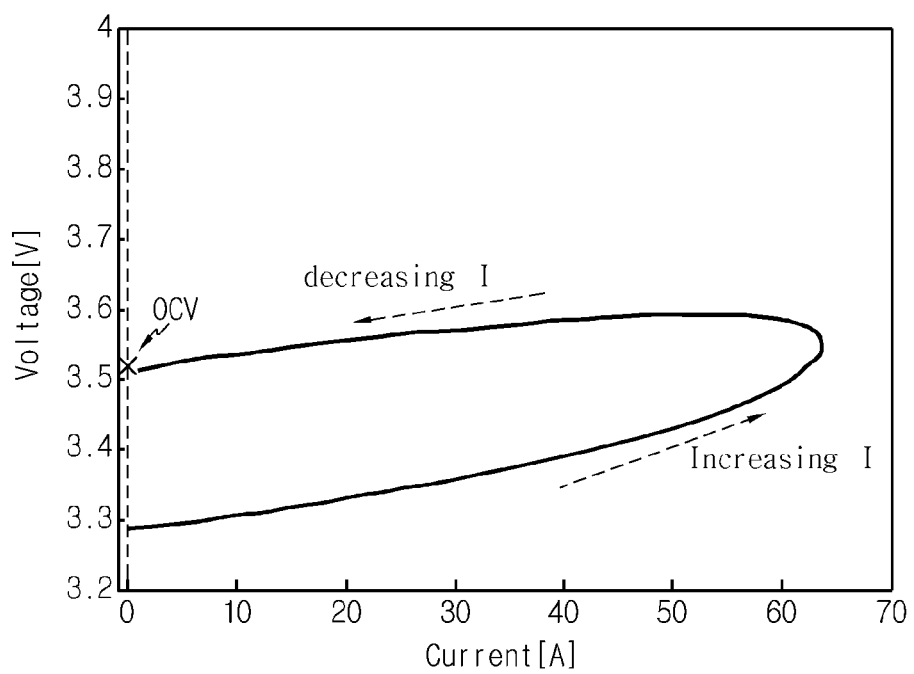
FIG. 11 is a graph plotting current-voltage data of a secondary battery including a blended cathode material measured during charging of the secondary battery for an interval B (experiment example 2).

FIG. 11 is a graph plotting current-voltage data of a secondary battery including a blended cathode material measured during charging of the secondary battery in a section B. Referring to FIG. 11, current-voltage data is plotted as a profile having a form of a hysteresis loop, and it is found that current-voltage data measured for a period during which a magnitude of a charging current decreases from a peak value to zero is closely approximate to a true OCV (a point indicated by X) of the secondary battery. This experiment result is the same as the experiment result of a secondary battery including a single cathode material.

Experiment Example 3

In this experiment, a difference between an estimated SOC of the secondary battery fabricated in Experiment example 1 using the present disclosure and an actually measured SOC of the secondary battery was measured.

Figure 12:
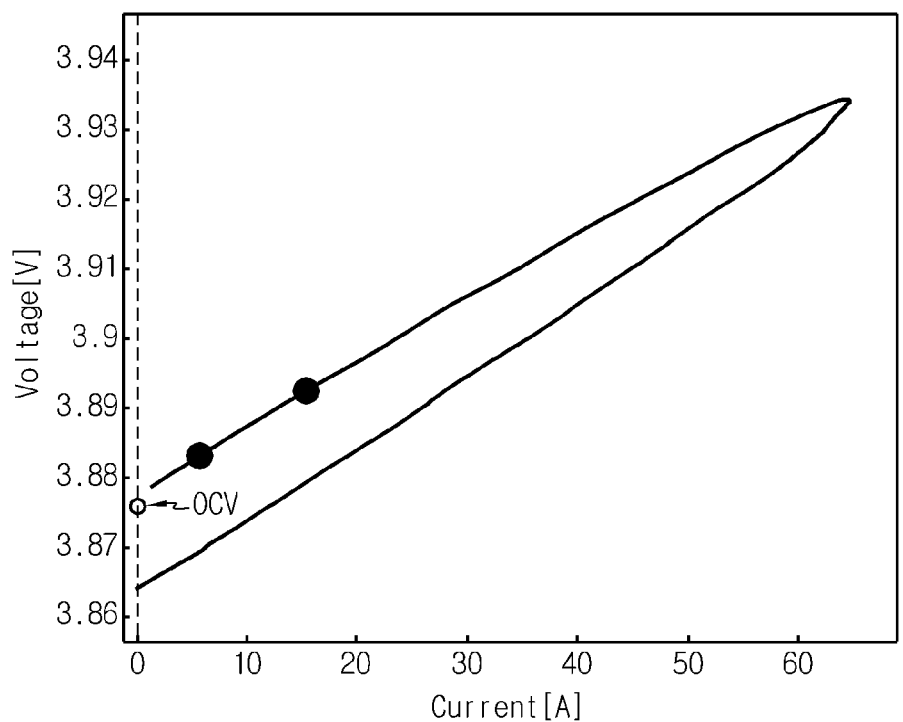
FIG. 12 is a graph illustrating two current-voltage data (extrapolation data) used when calculating a linear approximation equation, indicated on a current-voltage profile.

FIG. 12 is a graph illustrating two current-voltage data (extrapolation data) used when calculating a linear approximation equation, indicated on a current-voltage profile. One is data measured when a magnitude of a charging current decreases from a peak value to 15 A, and the other is data measured when a magnitude of an electric current decreases from a peak value to 5 A. The current-voltage data constituting the extrapolation data is all data measured when the magnitude of the charging current decreases to ⅓ (20 ampere) or less, based on the peak value (65 ampere).

Figure 13:
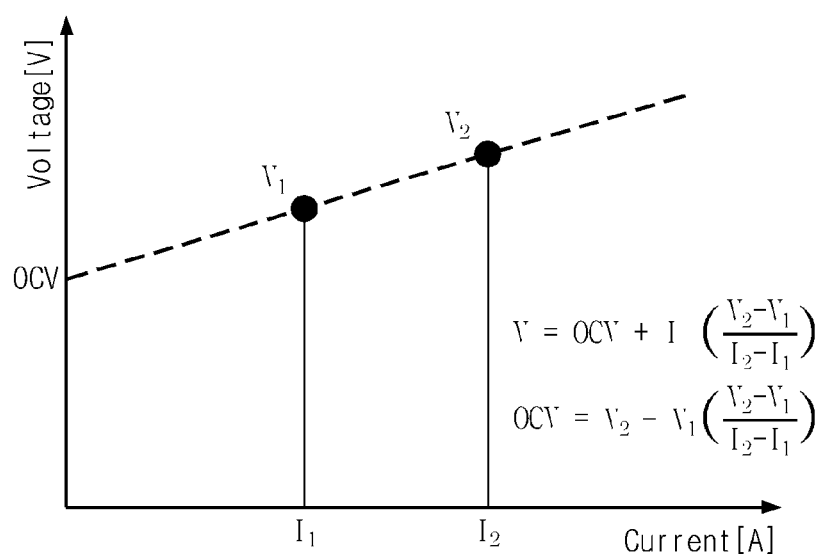
FIG. 13 is a graph illustrating a concept of estimating a Y intercept as an OCV of a secondary battery when calculating a linear approximation equation using two current-voltage data.

FIG. 13 is a graph illustrating a concept of estimating a Y intercept as an OCV of a secondary battery when calculating a linear approximation equation using two current-voltage data.

Figure 14:
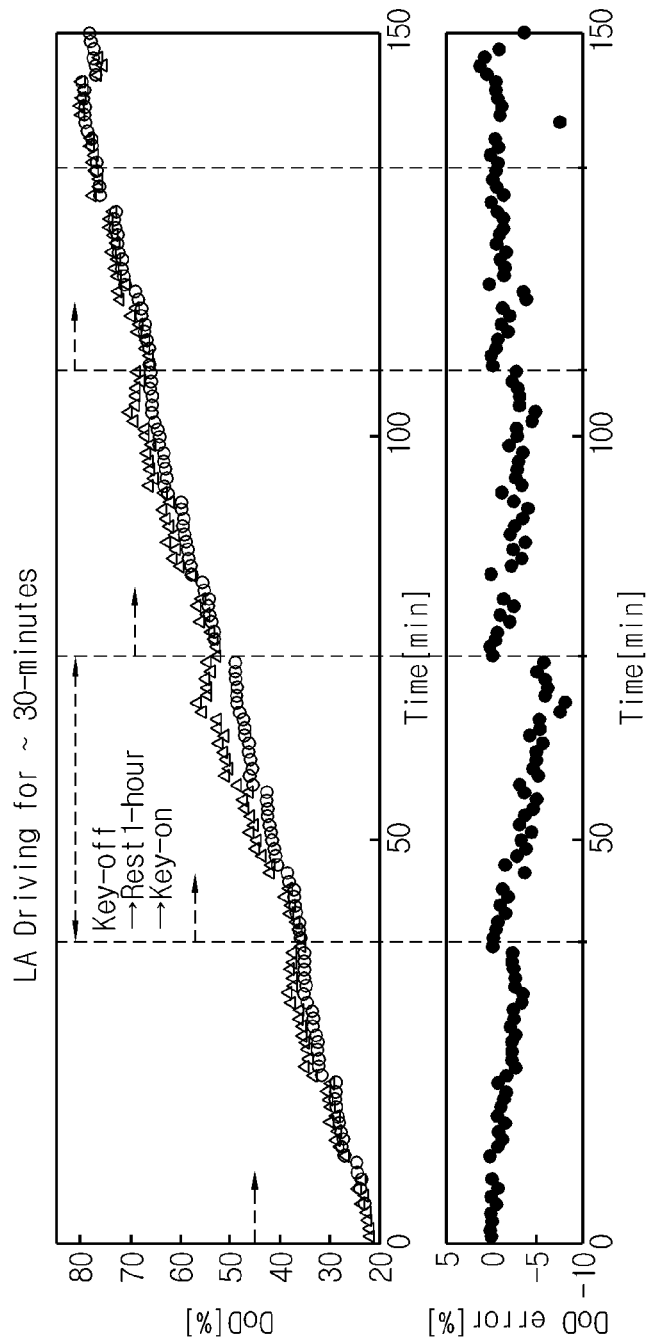
FIG. 14 is a graph illustrating a result of evaluating accuracy in estimating an SOC using the present disclosure during regeneration charging of a secondary battery when the secondary battery is discharged (traveling) and regeneration charged (braking for stop) in a driving pattern simulating driving in Los Angeles.

FIG. 14 is a graph illustrating a result of evaluating accuracy in estimating an SOC using the present disclosure during regeneration charging of a secondary battery while the secondary battery repeats a process of discharging (traveling) and regeneration charging (braking for stop) in a driving pattern simulating driving in Los Angeles as above.

When estimating an SOC of a secondary battery, the SOC of the secondary battery is estimated in a manner of sampling two current-voltage data by applying the condition shown in FIG. 12, calculating a Y intercept of a linear approximation equation using the sampled data, estimating the Y intercept as an OCV of the secondary battery, and mapping the estimated OCV to a corresponding SOC by referring to a lookup table that predefines SOCs for each OCV.

In FIG. 14, a horizontal axis represents a time (min), and a vertical axis represents a DOD. Because a DOD corresponds to (1-SOC), FIG. 14 may be said to show a result of measuring an SOC.

FIG. 14 shows two profiles on the 'DoD error chart'; a profile indicated by triangles shows a change in estimated SOC by the present disclosure, and a profile indicated by circles shows a change in true SOC.

In FIG. 14, four time lines (vertical dotted lines) are indicated, and a secondary battery is at rest for 1 hour at points at which each time line is indicated, without discharging and regeneration charging.

Referring to the 'DoD error chart' of FIG. 14, it can be seen that an SOC of a secondary battery estimated by the present disclosure follows a true SOC well, and an error is less than or equal to 5%.

When an SOC of a secondary battery is estimated through Ampere counting, an error in current counting is accumulated over time, whereas the present disclosure is found to estimate an SOC of a secondary battery within an error range of 5% quite accurately without accumulation of errors.

Experiment Example 4

It was found experimentally that an error occurred to a Y intercept of a linear approximation equation when polarization was accumulated on the electrode of the secondary battery 110.

In this experiment, the secondary battery including the blended cathode material of the above experiment example 2 was used, and under the assumption that the secondary battery is used in a hybrid vehicle, the secondary battery was charged and discharged according to a charging/discharging current profile simulating a driving pattern in Los Angeles as above. In this instance, discharging was set to be dominant over charging to cause an SOC of the secondary battery to decrease over time.

Figure 15:
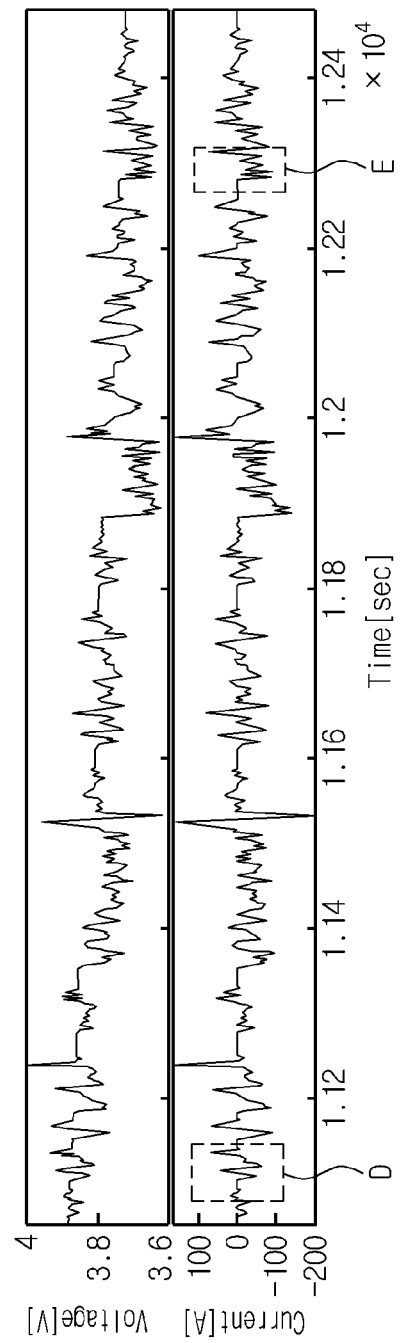
FIG. 15 is a graph illustrating charging/discharging current and voltage profiles of a secondary battery including a blended cathode material over time.

FIG. 15 is a graph illustrating charging/discharging current and voltage profiles of a secondary battery over time. In FIG. 15, a section in which an electric current is positive represents a charging period of the secondary battery, and in contrast, a section in which an electric current is negative represents a discharging period of the secondary battery. Also, sections D and E indicated by a dotted box simulate a situation in which the secondary battery is regeneration charged and corresponds to a section for which a Y intercept is calculated using a linear approximation equation according to the present disclosure.

Figure 16:
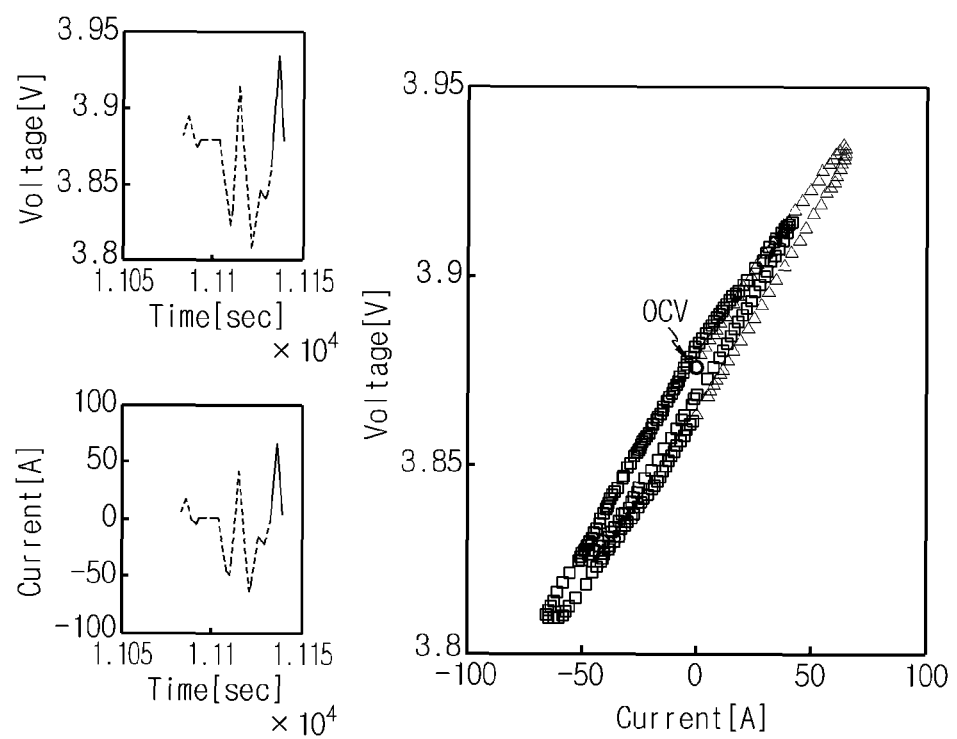
FIG. 16 is a graph illustrating current and voltage profiles sampled from a section D of FIG. 15 and an I-V chart plotted using them.

FIG. 16 illustrates current and voltage profiles sampled from the section D of FIG. 15 and an I-V chart plotting them, and graphs at the left side show current and voltage profiles and a graph at the right side shows a current-voltage profile.

In the I-V chart, a triangle profile corresponds to a section (regeneration charging period) indicated by a solid line in the voltage profile and the current profile. Also, a square profile corresponds to a section indicated by a dotted line in the voltage profile and the current profile.

Referring to FIG. 16, it can be seen that a Y intercept of a linear approximation equation which can be calculated from the current-voltage profile is nearly consistent with a true OCV of the secondary battery (see indication by circles). This experiment result supports that polarization accumulation on the electrode of the secondary battery is not intense when the secondary battery operates in the section D. Accordingly, in the time section such as the section D, an OCV of the secondary battery may be estimated directly using a Y intercept of a linear approximation equation.

Figure 17:
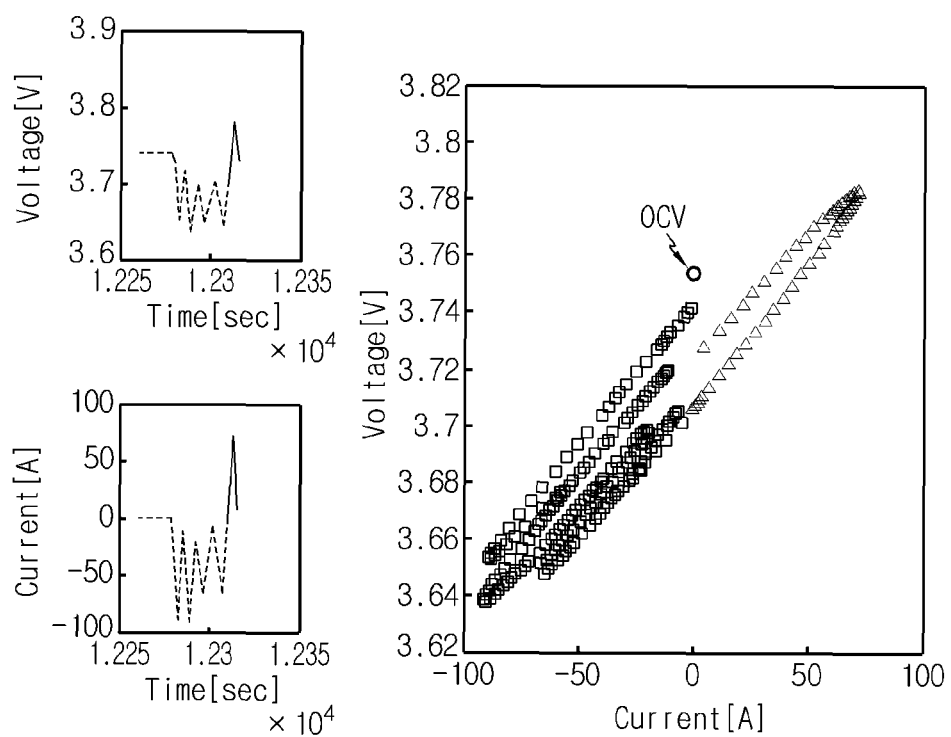
FIG. 17 is a graph illustrating current and voltage profiles sampled from a section E of FIG. 15 and an I-V chart plotted using them.

FIG. 17 illustrates current and voltage profiles sampled from the section E of FIG. 15 and an I-V chart plotting them, and graphs at the left side show current and voltage profiles and a graph at the right side shows a current-voltage profile.

Similar to FIG. 16, in the I-V chart, a triangle profile corresponds to a section (regeneration charging period) indicated by a solid line in the voltage profile and the current profile. Also, a square profile corresponds to a section indicated by a dotted line in the voltage profile and the current profile.

Referring to FIG. 17, it can be seen that there is a difference between a Y intercept of a linear approximation equation which can be calculated from the current-voltage profile and a true OCV of the secondary battery (see indication by circles). This experiment result supports that it is preferred to estimate an OCV of the secondary battery by correcting a Y intercept of a linear approximation equation because polarization accumulation on the electrode of the secondary battery is intense when the secondary battery operates in the section E.

Figure 18:
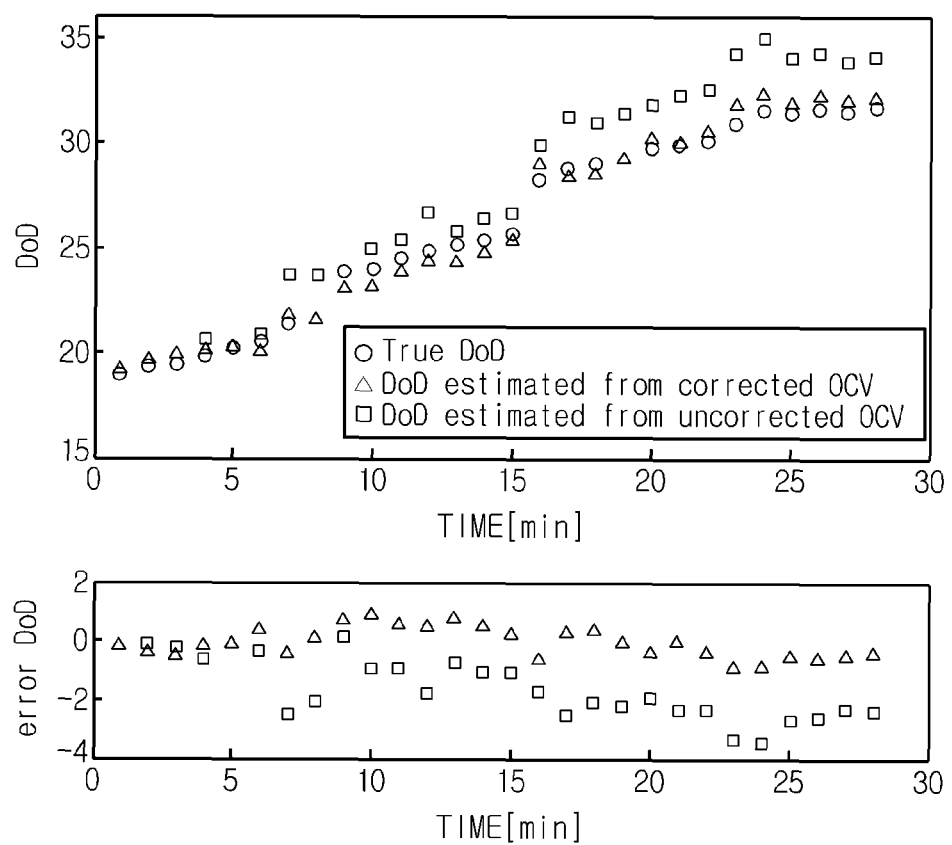
FIG. 18 is a graph illustrating a comparison of a true DoD of a secondary battery including a blended cathode material, a DoD estimated using an OCV corrected by the present disclosure, and a DoD estimated using an uncorrected OCV.

FIG. 18 is a graph illustrating a result of mapping a DoD from a lookup table using an OCV estimated according to the present disclosure during charging and discharging of a secondary battery including a blended cathode material for 30 minutes in a driving pattern simulating driving in Los Angeles as above. Here, a DoD corresponds to (1-SOC).

In this experiment, when estimating an OCV, each time a charging current having a peak is applied to the secondary battery for regeneration charging, a plurality of current-voltage data was measured under the condition applied in Experiment example 3, and then a linear approximation equation was determined. Subsequently, after a Y intercept of the linear approximation equation was temporarily estimated as an OCV (before correction), the RC circuit model shown in FIG. 2 was applied, and the OCV was corrected by reflecting the voltage error caused by accumulation of polarization on the temporarily estimated OCV. In this instance, the time constant of the RC circuit was tuned to 100 seconds through trial and error.

FIG. 18 shows three profiles on the 'DoD error chart'; a profile indicated by circles shows a true DoD, a profile indicated by squares shows a DoD estimated from an uncorrected OCV, and a profile indicated by triangles shows a DoD estimated from a corrected OCV. Also, in the 'DoD error chart' of FIG. 18, an error when estimating a DoD from an uncorrected OCV is indicated by squares, and an error when estimating a DoD from a corrected OCV is indicated by triangles.

Referring to FIG. 18, it can be seen that over charging/discharging time, an error in a DoD estimated from an uncorrected OCV gradually increases, whereas an error in a DoD estimated from a corrected OCV maintains a significantly low state.

Accordingly, from this experiment, it can be seen that when estimating an OCV by the present disclosure and estimating an SOC from this, an SOC may be estimated accurately even if polarization is accumulated on an electrode of a secondary battery.

The above experimental results support that an apparatus and method for estimating a parameter of a secondary battery according to the present disclosure may estimate an OCV and/or an SOC of a secondary battery conveniently and accurately even in a dynamic charging and discharging situation of the secondary battery.

Hereinabove, the present disclosure has been described in detail. However, it should be understood that the detailed description and specific examples, while indicating preferred embodiments of the disclosure, are given by way of illustration only, since various changes and modifications within the spirit and scope of the disclosure will become apparent to those skilled in the art from this detailed description.

What is claimed is:

1. An apparatus for estimating a parameter of a secondary battery, the apparatus comprising:
a plurality of sensors configured to measure a current and a voltage of a secondary battery while a charging current of the secondary battery decreases according to a charging pattern, the charging pattern including increasing the charging current to a peak value and then decreasing the charging current; and
a controller configured to:
input the current and the voltage from the plurality of sensors,
calculate a linear approximation equation representing a correlation between a current and a voltage from the measured current and the measured voltage, and
estimate an open-circuit voltage (OCV) of the secondary battery by using a polarization voltage of the secondary battery quantified through a resistor-capacitor (RC) circuit on a Y intercept of the linear approximation equation.

2. The apparatus for estimating the parameter of the secondary battery according to claim 1, wherein the controller is configured to estimate a state of charge (SOC) of the secondary battery from the estimated OCV.

3. The apparatus for estimating the parameter of the secondary battery according to claim 1, wherein the plurality of sensors is configured to measure the current and the voltage after a magnitude of the charging current decreases to ⅓ or less based on the peak value.

4. The apparatus for estimating the parameter of the secondary battery according to claim 3, wherein the plurality of sensors is configured to measure the current and the voltage after the magnitude of the charging current decreases to ⅙ or less based on the peak value.

5. The apparatus for estimating the parameter of the secondary battery according to claim 2, wherein the controller is configured to estimate a state of charge (SOC) corresponding to the estimated OCV using a lookup table or a lookup function that defines a correlation between an OCV and an SOC.

6. The apparatus for estimating the parameter of the secondary battery according to claim 2, wherein the plurality of sensors is configured to measure a temperature of the secondary battery and provides the measured temperature to the controller, and
wherein the controller is configured to estimate a state of charge (SOC) corresponding to the temperature of the secondary battery and the estimated OCV using a lookup table or a lookup function that defines a correlation between an OCV and a temperature and an SOC.

7. The apparatus for estimating the parameter of the secondary battery according to claim 1, wherein the plurality of sensors is configured to measure the current and the voltage while a charging current decreases from a peak value to zero when the secondary battery is regeneration charged by a charging current profile in which the charging current increases from zero to the peak value and then decreases zero.

8. The apparatus for estimating the parameter of the secondary battery according to claim 7, wherein the plurality of sensors is configured to measure the current and the voltage when the secondary battery is regeneration charged by the charging current profile after a discharging current of the secondary battery gradually decreases to zero.

9. The apparatus for estimating the parameter of the secondary battery according to claim 1, wherein the secondary battery includes a blended cathode material in which at least two cathode materials are blended.

10. An apparatus for estimating a parameter of a secondary battery, the apparatus comprising:
a plurality of sensors configured to measure a current and a voltage of a secondary battery repeatedly at a time interval according to a charging pattern, the charging pattern including increasing the charging current to a peak value and then decreasing the charging current; and
a controller configured to:
input the current and the voltage from the plurality of sensors,
identify the current and the voltage measured while the charging current decreases from the peak value,
calculate a linear approximation equation representing a correlation between a current and a voltage from the measured current and the measured voltage, and
estimate an open-circuit voltage (OCV) of the secondary battery by using a polarization voltage of the secondary battery quantified through a resistor-capacitor (RC) circuit on a Y intercept of the linear approximation equation.

11. The apparatus for estimating the parameter of the secondary battery according to claim 10, wherein the controller is configured to estimate a state of charge (SOC) of the secondary battery from the estimated OCV.

12. The apparatus for estimating the parameter of the secondary battery according to claim 10, wherein the controller is configured to identify the current and the voltage among measured current and the measured voltage after a magnitude of the charging current decreases to ⅓ or less based on the peak value.

13. The apparatus for estimating the parameter of the secondary battery according to claim 10, wherein the controller is configured to identify the current and the voltage among the current and the voltage measured after a magnitude of the charging current decreases to ⅙ or less based on the peak value.

14. The apparatus for estimating the parameter of the secondary battery according to claim 11, wherein the controller is configured to estimate a state of charge (SOC) corresponding to the estimated OCV using a lookup table or a lookup function that defines a correlation between an OCV and an SOC.

15. The apparatus for estimating the parameter of the secondary battery according to claim 11, wherein the plurality of sensors is configured to measure a temperature of the secondary battery and provide the measured temperature to the control means, and the control means is configured to estimate a state of charge (SOC) corresponding to the temperature of the secondary battery and the estimated OCV using a lookup table or a lookup function that defines a correlation between an OCV and a temperature and a SOC.

16. The apparatus for estimating the parameter of the secondary battery according to claim 10, wherein the plurality of sensors is configured to measure the current and the voltage repeatedly at a time interval while the charging current decreases from the peak value to zero when the secondary battery is regeneration charged in such a pattern that the charging current increases from zero to the peak value and then decreases zero.

17. The apparatus for estimating the parameter of the secondary battery according to claim 16, wherein the plurality of sensors is configured to measure the current and the voltage repeatedly at a time interval when the secondary battery is regeneration charged after a discharging current of the secondary battery gradually decreases to zero.

18. The apparatus for estimating the parameter of the secondary battery according to claim 10, wherein the secondary battery includes a blended cathode material in which at least two cathode materials are blended.

19. An electric-powered device comprising the apparatus defined in claim 1.

20. A method for estimating, by an apparatus, a parameter of a secondary battery, the method comprising:

measuring, by a plurality of sensors in the apparatus, a current and a voltage of a secondary battery while a charging current of the secondary battery decreases according to a charging pattern, the charging pattern including increasing the charging current to a peak value and then decreasing the charging current;

inputting, by a controller in the apparatus, the current and the voltage from the plurality of sensors;

calculating, by the controller in the apparatus, a linear approximation equation representing a correlation between a current and a voltage from the measured current and the measured voltage; and estimating an open-circuit voltage (OCV) of the secondary battery by using a polarization voltage of the secondary battery quantified through a resistor-capacitor (RC) circuit on a Y intercept of the linear approximation equation.

21. The method for estimating, by the apparatus, the parameter of the secondary battery according to claim 20, further comprising:

estimating a state of charge (SOC) of the secondary battery from the estimated OCV.

22. The method for estimating, by the apparatus, the parameter of the secondary battery according to claim 20, further comprising:

displaying, storing, or outputting the estimated OCV.

23. The method for estimating, by the apparatus, the parameter of the secondary battery according to claim 21, further comprising:

displaying, storing, or outputting the estimated SOC.

24. A method for estimating, by an apparatus, a parameter of a secondary battery, the method comprising:

measuring, by a plurality of sensors in the apparatus, a current and a voltage of a secondary battery while a charging current of the secondary battery increases according to a charging pattern, the charging pattern including increasing the charging current to a peak value and then decreasing the charging current;

identifying the current and the voltage measured while the charging current decreases from the peak value;

calculating a linear approximation equation representing a correlation between a current and a voltage from the measured current and the measured voltage; and estimating an open-circuit voltage (OCV) of the secondary battery by using a polarization voltage of the secondary battery quantified through a resistor-capacitor (RC) circuit on a Y intercept of the linear approximation equation.

25. The method for estimating, by the apparatus, the parameter of the secondary battery according to claim 24, further comprising:

estimating a state of charge (SOC) of the secondary battery from the estimated OCV.

26. The method for estimating, by the apparatus, the parameter of the secondary battery according to claim 24, further comprising:

displaying, storing, or outputting the estimated OCV.

27. The method for estimating, by the apparatus, the parameter of the secondary battery according to claim 25, further comprising:

displaying, storing, or outputting the estimated SOC.

* * * * *